United States Patent
Zitlaw

(10) Patent No.: US 9,921,763 B1
(45) Date of Patent: Mar. 20, 2018

(54) MULTI-BANK NON-VOLATILE MEMORY APPARATUS WITH HIGH-SPEED BUS

(71) Applicant: Crossbar, Inc., Santa Clara, CA (US)

(72) Inventor: Cliff Zitlaw, San Jose, CA (US)

(73) Assignee: CROSSBAR, INC., Santa Clara, CA (US)

(*) Notice: Subject to any disclaimer, the term of this patent is extended or adjusted under 35 U.S.C. 154(b) by 277 days.

(21) Appl. No.: 14/750,293

(22) Filed: Jun. 25, 2015

(51) Int. Cl.
*G06F 3/06* (2006.01)
*G11C 14/00* (2006.01)
*G06F 12/06* (2006.01)

(52) U.S. Cl.
CPC ......... *G06F 3/0619* (2013.01); *G06F 3/0665* (2013.01); *G06F 3/0689* (2013.01); *G06F 12/0623* (2013.01); *G11C 14/0045* (2013.01); *G06F 2003/0692* (2013.01); *G06F 2212/2532* (2013.01)

(58) Field of Classification Search
None
See application file for complete search history.

(56) References Cited

U.S. PATENT DOCUMENTS

| | | | |
|---|---|---|---|
| 5,692,138 A | 11/1997 | Fandrich | |
| 5,909,703 A | 6/1999 | Hansen et al. | |
| 5,926,642 A | 7/1999 | Favor | |
| 6,016,537 A | 1/2000 | Hansen | |
| 6,061,749 A | 5/2000 | Webb et al. | |
| 6,081,783 A | 6/2000 | Divine et al. | |
| 6,195,674 B1 | 2/2001 | Eelboume | |
| 6,260,101 B1 | 7/2001 | Hansen | |
| 8,117,351 B1* | 2/2012 | Mangalindan | G06F 13/4291 710/3 |
| 2002/0007451 A1 | 1/2002 | Cho et al. | |
| 2002/0053015 A1* | 5/2002 | Tan | G06F 9/30029 712/42 |

(Continued)

OTHER PUBLICATIONS

Mobile LPDDR3 SDRAM, Invention disclosure conference, 2014, 160 Pages, Micron Technology, Inc., Boise, Idaho.

(Continued)

*Primary Examiner* — Sean D Rossiter
(74) *Attorney, Agent, or Firm* — Amin, Turocy & Watson, LLP

(57) ABSTRACT

Providing for a memory apparatus comprising multiple banks of non-volatile memory and a high-speed data bus is described herein. By way of example, the memory apparatus can employ a standard or near-standard DRAM bus as an interface to high-performance two-terminal memory arrays. Interleaved operation can facilitate throughputs over 2gigabytes/second, in various embodiments, and larger throughputs in at least some embodiments, by interleaving multiple memory banks that are separately addressed via one or more mode registers, referred to as an index register(s). Further, the memory apparatus can have one or two terabytes of total storage, with capacity to increase storage volume. According to various embodiments, the memory apparatus can operate with a standard DRAM controller, or a memory controller configured with a DRAM communication protocol, modified in software or firmware to match configurations of the non-volatile memory employed for the multiple banks of memory.

20 Claims, 13 Drawing Sheets

(56) References Cited

U.S. PATENT DOCUMENTS

| | | | |
|---|---|---|---|
| 2004/0003209 A1* | 1/2004 | Mitsuishi | G06F 9/30018 712/225 |
| 2005/0015539 A1 | 1/2005 | Horii | |
| 2005/0172089 A1 | 8/2005 | Klingman | |
| 2007/0118713 A1 | 5/2007 | Guterman | |
| 2008/0082750 A1 | 4/2008 | Okin et al. | |
| 2008/0082751 A1 | 4/2008 | Okin et al. | |
| 2008/0082766 A1 | 4/2008 | Okin et al. | |
| 2008/0126682 A1* | 5/2008 | Zhao | G06F 3/0613 711/103 |
| 2008/0162790 A1* | 7/2008 | Im | G11O 5/02 711/103 |
| 2009/0138626 A1* | 5/2009 | Le | G06F 12/06 710/23 |
| 2010/0274960 A1* | 10/2010 | Lee | G06F 12/0607 711/106 |
| 2010/0332718 A1 | 12/2010 | Farrell et al. | |
| 2011/0185109 A1* | 7/2011 | Karabatsos | G11C 16/10 711/103 |
| 2012/0173851 A1 | 7/2012 | Lewis | |
| 2012/0236650 A1 | 9/2012 | Nazarian | |
| 2013/0227229 A1* | 8/2013 | Ishikawa | G06F 12/00 711/154 |
| 2013/0297864 A1* | 11/2013 | Gupta | G11C 7/1042 711/105 |
| 2013/0339829 A1* | 12/2013 | Vargas | G06F 11/1004 714/807 |
| 2014/0162470 A1 | 6/2014 | Fricker | |
| 2014/0269139 A1 | 9/2014 | Wang | |
| 2014/0284535 A1* | 9/2014 | Saitoh | H01L 27/2436 257/2 |
| 2014/0372670 A1* | 12/2014 | Vasilyuk | G06F 12/0246 711/103 |
| 2015/0095565 A1* | 4/2015 | Morris | G06F 13/1689 711/109 |
| 2016/0292092 A1 | 10/2016 | Gavens et al. | |
| 2017/0003880 A1* | 1/2017 | Fisher | G06F 3/061 |

OTHER PUBLICATIONS

NAND Flash Memory, Invention disclosure conference, 2010, 167 Pages, Micron Technology, Inc., Boise, Idaho.

Office Action for U.S. Appl. No. 14/749,947 dated May 5, 2017, 51 pages.

Office Action for U.S. Appl. No. 14/750,740 dated Jun. 2, 2017, 21 pages.

Office Action for U.S. Appl. No. 14/750,740 dated Jan. 17, 2018, 22 pages.

* cited by examiner

MULTI-BANK NON-VOLATILE MEMORY APPARATUS WITH HIGH-SPEED BUS

CROSS-REFERENCE TO RELATED APPLICATIONS

This application for patent is related to co-pending U.S. patent application Ser. No. 14/750,740, filed Jun. 25, 2015 and entitled MEMORY APPARATUS WITH NON-VOLATILE, TWO-TERMINAL MEMORY AND EXPANDED, HIGH-SPEED BUS and is related to co-pending U.S. patent application Ser. No. 14/749,947, filed Jun. 25, 2015 and entitled MULTIPLE-BANK MEMORY DEVICE WITH STATUS FEEDBACK FOR SUBSETS OF MEMORY BANKS, each of which are expressly incorporated by reference herein in their entireties and for all purposes.

TECHNICAL FIELD

This disclosure relates generally to electronic memory; as one example, the disclosure describes an electronic memory comprising multiple banks of non-volatile memory with a high-speed interface and expanded command and address bus.

BACKGROUND

A recent innovation within the field of integrated circuit technology is two-terminal memory technology. Two-terminal memory technology is contrasted, for instance, with gate-controlled transistors in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applied to the third terminal, two-terminal memory devices can be controlled by applying a stimulus at one or both of the pair of conductive contacts. The inventor(s) of the present disclosure is further aware of a variety of two-terminal memory technologies, such as phase-change memory, magneto-resistive memory, conductive-bridging memory, as well as others.

One two-terminal memory worth noting is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others.

In light of the above, the inventor endeavors to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject application for patent provides a memory apparatus comprising a high-performance, two-terminal memory with high data throughput. In some embodiments, the memory apparatus can be configured to operate according to a standard data throughput protocol, facilitating plug-and-play type integration with existing electronic systems, with minimal (if any) configuration overhead. In one or more embodiments, the memory apparatus can comprise 128 or more distinct banks of resistive-switching memory, a standard low power double data rate (LPDDR) bus, and circuitry to facilitate interleave-processing among a large number of memory banks, to take advantage of the relatively high data capacity of the LPDDR bus.

According to one or more additional embodiments, a disclosed multi-bank memory apparatus can be configured to generate bank-specific status information to inform array read, write or management operations. In further embodiments, global status information can be generated by the multi-bank memory apparatus to provide high-level, general status data in addition to the bank-specific status information. Global status data can be utilized, e.g., to notify a host device of a general change in status related to array operations performed by the multi-bank memory apparatus. The host device can then request bank-specific status information to identify idle memory banks (e.g., capable of performing an operation), or to identify and address memory errors.

In one or more further other embodiments, a disclosed multi-bank memory apparatus is provided having inter-bank configurability. In such embodiments, a first subset of memory banks can be configured according to a first memory configuration, whereas a second subset of memory banks can be configured according to a second memory configuration. In various embodiments, different memory banks can be configured for single level cell (SLC) or multi level cell (MLC) operation, for different write or read voltages, different latencies, and so on, as suitable. Accordingly, a disclosed memory apparatus can provide significant flexibility and adaptability for a wide range of functions in the memory space.

In another embodiment, the present disclosure provides an electronic memory. The electronic memory can comprise a memory array comprising multiple banks of memory and a communication interface comprising a command and address bus, and a data bus. Further, the electronic memory can comprise a set of mode registers comprising an index register configured to store at least one bit of information that is read or written in response to an index register command received on the command and address bus. In addition to the foregoing, the electronic memory can comprise a command and address decoder configured to receive an array command on the command and address bus, and employ the at least one bit of information stored by the index register to identify a first subset of the multiple banks of memory targeted by the array command. In various embodiments, the electronic memory can additionally comprise logic circuitry configured to execute the array command on the first subset of the multiple banks of memory identified from the at least one bit of information, wherein data read from the first subset of the multiple banks of memory or data written to the first subset of the multiple banks of memory in conjunction with executing the array command is transferred on the data bus.

In an embodiment(s), the disclosure provides a method of operating a memory device. The method can comprise compiling an array access command for performing a memory operation on a first memory bank of a set of memory banks of the memory device. In addition, the method can comprise compiling a mode register write command and including in the mode register write command. In one or more embodiments, compiling the mode register write command can further comprise register address data identifying an index register of a set of mode registers of the memory device as a target of the mode register write command and bank address data identifying the first memory bank of the set of memory banks, the bank address data to be written by the memory device to the index register in conjunction with executing the mode register write command. Further to the above, method can comprise issuing the mode register write command to the memory device and issuing the array access command to the memory device.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
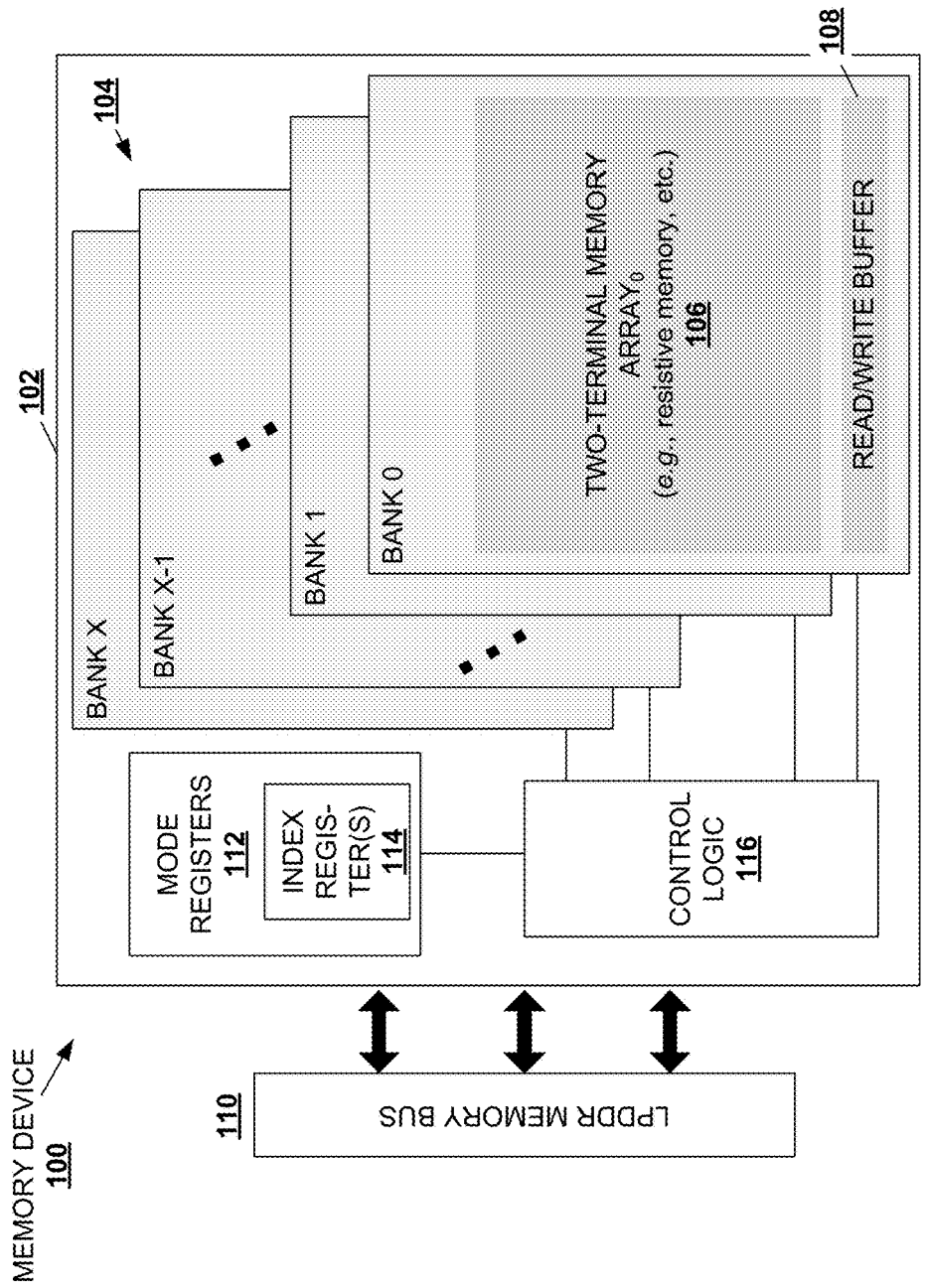
FIG. 1 illustrates a block diagram of an example multi-bank memory operating with a high throughput standard (or near-standard) bus, in an embodiment(s)

The present disclosure relates to electronic devices comprising multiple banks of memory, which can be accessed or controlled by a host device to perform memory operations. The host device can operate upon the memory banks as a single group, or can control respective subsets of the memory banks independently. For example, one or two memory banks (or any other suitable subset) can be assigned a first memory operation, whereas other memory banks can be assigned a second memory operation that can be performed at least in part concurrent with the first memory operation. This can be accomplished, for instance, where the first memory operation and second memory operation target different subsets of memory (e.g., different memory banks, different subsets of different memory banks, and so on), and the subsets of memory have sufficient circuitry to operate independently. In theory, a larger number of independently-operable memory banks facilitate greater capacity for interleaved operations, where sufficient circuitry is provided to facilitate concurrent operations on subsets of memory banks.

In disclosed embodiments, a multi-bank, non-volatile memory architecture is provided that facilitates operational interleaving among multiple banks of two-terminal non-volatile memory, coupled with a standard, high-throughput interface. The standard interface can employ a standard command and address bus, and a standard data bus to achieve compatibility with existing electronic systems. A host device, such as a computer, a memory controller, etc., can operate with the disclosed memory architecture utilizing a standard communication protocol, in some embodiments, while realizing improved throughput, memory performance, longevity and reliability of two-terminal memory. The standard communication protocol can be a lower power double date rate (LPDDR) protocol, such as a LPDDR3 or LPDDR4 protocol, or the like, or a suitable variation thereof (e.g., a subsequent enhancement). In at least one embodiment, the interface can be near-standard; for example, the interface can have one or more software or firmware modifications consistent with standardized hardware requirements, thereby minimizing overhead in achieving compatibility with standard systems.

In one or more embodiments, a non-volatile memory device is provided having high read and write performance, as well as much higher throughput than conventional non-volatile memory. The non-volatile memory device can be a removable memory device (e.g., a thumb drive, a secure digital (SD) card, etc.), internal or external hard drive (e.g., solid-state hard drive, and so forth), embedded memory, or the like. In various embodiments, the non-volatile memory device can comprise a 16-bit data bus and multiple banks of two-terminal memory chips with significant interleaved operations. In further embodiments, the non-volatile memory device can have a 10-pin, 20-bit command and address bus, that is extended in software or logic to achieve an expanded address space. The expanded address space can be employed to address subsets of multiple banks of memory independently, facilitating the interleaved operations. The inventor(s) estimates data bus throughput values up to 3.2 gigabytes (GB) per second for 800 megahertz (Mhz) data bus clock (or larger, for faster clock speeds), can be achieved in at least some disclosed embodiments. These are significantly faster throughputs than conventional non-volatile memory devices allow, and also incorporate the high write and erase speeds, data retention, and longevity of two-terminal memory. Furthermore, the non-volatile memory device can employ standard interface hardware and communication protocols to communicate with a host device, greatly simplifying compatibility with existing electronic devices.

In further disclosed embodiments, a multi-bank memory device is provided that can generate and output bank-specific status information to inform array operations or management. In at least one embodiment, subsets of memory banks of the memory device can comprise a status register configured to track and maintain status information for an associated subset of the memory banks. Status information can be output in response to a host query identifying a specific subset of memory banks. In other embodiments, status information can be included with a reply to an array command(s) targeting the specific subset(s) of memory banks. In still other embodiments, the multi-bank memory device can output global status data—informing a host of high-level status information—in addition to subset-specific status information. In various embodiments, status information can include busy/idle information, operation pass/fail information, error correction code (ECC) pass/fail information, or the like, or a suitable combination thereof.

A set of status information can be generated and provided for as few as one memory bank, as many as all memory banks, or a suitable number there between. For instance, in various embodiments, bank-specific status information can be generated for each memory bank of a multi-bank memory device. Bank-specific status information can be output in response to a query, upon completion of a mode register operation, upon completion of a memory array operation(s), as part of memory bank maintenance or management operations (e.g., read/write error correction, ECC error correction, and so on), or the like. However, the subject disclosure is not so limited, and status information can be generated or reported for a plurality of memory banks (e.g., two memory banks, three memory banks), or can be generated and reported for non-homogenous numbers of memory banks (e.g., one report can include status information for one memory bank, and a second report can include status information for two memory banks, and so on).

By providing status information for subsets of multiple memory banks, a host device can increase a duty cycle of multi-bank memory, achieving higher memory efficiencies and potentially higher throughput. As an example, consider a memory device configured to output only global status information. Such a device is limited to status information that is true for all memory banks or no memory banks, but not information that is true for some memory banks but not others. Without knowing which memory banks are busy, for instance, a host device may be required to wait for all memory banks to complete existing operations before initiating a new operation. This could lead to significant downtime as some memory banks, having completed queued memory operations, are idle while other memory banks continue with queued operations. Likewise, sophisticated error correction techniques that apply corrections directly to affected areas of memory may be more difficult to deploy. On the other hand, the various embodiments disclosed herein facilitate greater granularity of error correction operations. A host is enabled, by various disclosed embodiments, to issue new commands to subsets of memory banks as they become idle, more efficiently targeting error correction routines to affected areas of memory, and achieving much more efficient utilization of multi-bank memory resources in general.

In addition to the foregoing, some embodiments disclose a memory device having global memory bank status capabilities, combined with more granular status information affecting a subset of memory banks. Global memory bank status information can be output by the memory device as an interrupt, notifying a host of a change in status information, as one example. Upon receiving global status information (e.g., sampling, or in response to an interrupt), the host can initiate more granular data acquisition routines to obtain status information specific to one or more subsets of memory banks to inform subsequent processes, making those processes more efficient.

In still other embodiments, the subject disclosure provides for disparate memory bank configurations for different subsets of memory banks in a multi-bank memory device. These embodiments enable configuration programming for a first subset of memory banks that can be different from configuration programming of a second subset of memory bank. As one example, a first subset of memory banks can be configured for multi-level cell (MLC) operation (e.g., having the capacity to store more than one bit of information), whereas a second subset of the memory banks can be configured for single level cell (SLC) operation (e.g., storing a single bit of information). As another example, the first subset of memory banks can be configured to operate according to a first clock speed, a first latency, or other physical characteristic, whereas a second subset of memory banks can be configured to operate according to a second clock speed, a second latency, and so on. In some embodiments, one or more mode registers can be established for configuration programming of subsets of memory banks. A mode register operation targeting these one or more mode registers can be utilized to implement subset-specific memory bank configuration programming, or reading current subset-specific configuration programming.

Referring now to the drawings, FIG. 1 illustrates a block diagram of an example multi-bank memory device 100 according to one or more embodiments of the present disclosure. Multi-bank memory device 100 can comprise high-performance, non-volatile memory (e.g., two-terminal memory arrays, such as resistive-switching memory) with external data throughput that could previously be achieved only with volatile memory. Moreover, multi-bank memory device 100 can utilize a standard (or near-standard) interface, facilitating inter-operability with electronic devices employing the standard interface and associated communication protocol. Thus, in addition to high performance non-volatile memory, multi-bank memory device 100 is expected to be operable with existing electronic devices with little or no overhead.

Multi-bank memory 100 can comprise a memory chip 102 having a plurality of independent memory banks 104. Memory banks 104 can perform array operations (e.g., read, write, etc.) or management functions (e.g., program/read error correction, ECC correction, etc.) independently of other ones of memory banks 104. Further, subsets of memory banks 104 can perform such operations or functions concurrently with other operations/functions performed by other subsets of memory banks 104. Accordingly, memory chip 102 can perform multiple operations/functions concurrently to achieve high performance interleaving. In some embodiments, memory chip 102 can perform as many interleaved operations/functions as a number, X, of independent memory banks 104. In various embodiments, memory chip 102 can comprise X=128, 256, 512, 1024, 2048, or even larger independently operable memory banks 104. In other embodiments, memory chip 102 can perform as many interleaved operations/functions as a number (e.g., N), of independently-operable subsets of memory banks 104. For instance, memory chip 102 could comprise X=2048 memory banks 104, with N=1024 subsets of independently operable memory banks, comprising 2 memory banks per subset. Other suitable implementations having different numbers of memory banks, X, or independently operable subsets of memory banks, N (in which a subset of memory banks can be operated independently of other respective subsets of memory banks), are considered within the scope of the present disclosure.

Respective ones of memory banks 104 can include an array of two-terminal memory 106. In one or more embodiments, array of two-terminal memory 106 can comprise high performance, non-volatile memory such as resistive-switching memory (e.g., resistive random access memory), phase-change memory, magneto-resistive memory, conductive-bridging memory, organic memory, or the like, or a suitable combination of the foregoing. In at least one embodiment, two-terminal memory 106 can comprise one or more memory banks having one type of non-volatile two-terminal memory (e.g., resistive-switching memory), and one or more memory banks having another type of non-volatile two-terminal memory (e.g., phase-change memory). Respective memory banks 104 (or subsets of memory banks) can have a read/write buffer 108, and other suitable circuitry for queuing instructions, data, operations, and the like.

Mode registers 112 are provided to facilitate programming memory chip 102 or memory banks 104 according to different modes of operation. Mode registers 112 can facilitate general programming, affecting all memory banks 104, as well as subset-specific programming, affecting one or more target subsets of memory banks 104. Example modes of operation can include operation voltages (e.g., read voltage(s), write voltage(s), inhibit voltage(s), pre-charge voltage(s), etc.), array access latency(ies) (e.g., column access strobe latency, row access strobe latency, etc.), burst configuration (e.g., burst mode, bust length, and so on), among others. In various disclosed embodiments, mode registers 112 can comprise one or more function-specific mode registers to facilitate programming of function-specific operations.

One example of a function-specific mode register 112 is an index register(s) 114. Index register(s) 114 can be configured to facilitate an expanded addressing space for memory chip 102. The expanded addressing space can be employed for array operations, in some embodiments, for mode register operations in other embodiments, or function-specific operations in still other embodiments, (e.g., configuration operations, status-related operations, etc.), or other operations, or suitable combinations of the foregoing in additional embodiments.

In some embodiments, index register(s) 114 can store a number of bits suitable to provide a unique identifier for each individually-operable subset of memory banks 104. As an illustrative example, where memory chip 102 comprises 128 memory banks 104 (or independently-operable subsets of memory banks 104), index register(s) 114 can be configured to store 7 bits of data; for 1024 memory banks 104 (or independently-operable subsets of memory banks 104), index register(s) 114 can be configured to store 10 bits of data, and so on. In response to an operation targeting a specific memory bank(s) of memory chip 102, control logic 116 can be configured to read the identifier from index register(s) 114 to, at least in part, determine the specific memory bank(s) of memory chip 102 targeted by the operation.

In alternative or additional embodiments, the identifier stored in index register(s) 114 is sufficient to uniquely identify a memory bank 104 (or independently-operable subset of memory banks 104). In other embodiments, the identifier stored in index register(s) 114 can be combined with additional identifier information provided with the operation, and the combination of the stored identifier and additional identifier information can uniquely identify the memory bank 104 (or independently-operable subset of memory banks 104). In the latter embodiments, control logic 116 can be configured to properly combine the stored identifier (from index register(s) 114) with the additional identifier information (received as part of a command or instruction) to decode an identifier of the memory bank(s) 104. Various mechanisms for encoding and decoding the stored identifier and the additional identifier information are considered within the scope of the subject disclosure. Examples can include, storing a number of most significant bits in index register(s) 114 and providing another number of least significant bits with the operation; control logic 116 can then append the most significant bits (from the index register(s)) to the least significant bits (received with the operation) to identify the memory bank(s) 104. In an alternative example, the reverse can be implemented, where stored identifier data include a number of least significant bits, and another number of most significant bits can be provided with the operation. Control logic 116 can then append the most significant bits provided with the operation onto the least significant bits stored in index register(s) 114. In still other examples, control logic 116 can be configured to interleave or partially interleave stored identifier data and additional identifier information, or employ an algorithm to decode the information that uniquely identifies the memory bank(s) 104, or the like.

Index register(s) 114 can be written to or read from utilizing a mode register operation that targets index register(s) 114. An index register write, for instance, can be utilized to write identifier information to index register(s) 114. Such an index register write can precede a subsequent operation that utilizes the identifier information written to index register(s) 114 to identify a target of the subsequent operation. For a subsequent array operation, the target would generally be a memory bank 104 (or independently-operable subset of memory banks). In alternative or additional embodiments, a subsequent mode register operation can employ the identifier information written to index register(s) 114 to, at least in part, identify a target mode register. The latter embodiments could be implemented, for instance, where memory chip 102 comprises a greater number of mode registers than can be addressed by a LPDDR communication protocol associated with LPDDR memory bus 110.

LPDDR memory bus 110 can be a standard DRAM bus, in some embodiments, operating according to a standard DRAM communication protocol. Thus, LPDDR memory bus 110 can have 10 command and address pins (for 20 bits of command and address data per clock cycle; 10 bits on a rising clock edge and 10 bits on a falling clock edge) and a suitable number of data pins, such as 8 data pins, 16 data pins, 24 data pins, 32 data pins, or other suitable number of data pins. This can be accomplished, e.g., by manufacturing a data bus with the number of data pins on a monolithic chip, or, for instance, by stacking multiple dies at fabrication (e.g., 2×8-pin dies to yield a 16-pin multi-die chip)). Thus, as one example utilized for FIG. 1, the data bus can have 16 data pins (for 32 bits of data per clock cycle; 16 bits on the rising clock edge and 16 bits on the falling clock edge), although it should be appreciated that 24 data pins, 32 data pins, 40 data pins, and so on, could be utilized in other embodiments. With reference to the 16 data pin embodiment(s), a maximum data throughput at LPDDR memory bus 110 will be inversely proportional to a clock speed of LPDDR memory bus 110. For an 800 MHz clock employed by the LPDDR3 standard, for instance, LPDDR memory bus 110 can transfer as many as 1600 Mbits per data pin/second (or 200 MB per pin/second, 100 MB/pin/s on the rising clock edge, and 100 MB/pin/s on the falling clock edge). If all 16 data pins are saturated with data, then, LPDDR memory bus 110 can have an upper limit of 200 Mbytes (MB)*16 pins, or 3.2 GB/second throughput.

To saturate the 32-pin LPDDR memory bus 110, multiple memory banks 104 can be operated concurrently, at a maximum read or write speed of the two-terminal memory technology employed for the memory arrays 106. As an illustrative example, consider a resistive-switching memory technology having a maximum read speed between two-terminal memory array 106 and read/write buffer 108 of about 400 nanoseconds (ns), and a maximum write speed from read/write buffer 108 to two-terminal memory array 106 of about 1.6 microseconds (µs). Utilizing a 256-byte read/write buffer 108, a single memory bank could output (for reading) 256 bytes every 0.4 µs, or 640 megabytes (MB) per second. In terms of hardware performance (e.g., ignoring potential latency resulting from additional mode register writes for bank-specific addressing), to achieve 3.2 GB per second throughput from a subset of two-terminal memory arrays 106 to associated read/write buffers 108, 5 interleaved memory bank read operations could be employed: 640 MB/s×5 interleaved reads=3.2 GB/s to five read/write buffers 108. For write operations at the 1.6 µs write speed, a single memory bank could write data from read/write buffer 108 at a maximum speed of about 160 MB per second. To achieve the 3.2 GB per second throughput, again, 20 interleaved memory bank writes could be employed: 20 interleaved writes×160 MB per second/per bank=3.2 GB/sec from the 20 banks of two-terminal memory 106 to 20 respective read/write buffers 108.

A set of array operations to memory chip 102 will generally comprise a mode register write followed by an array command. The mode register write stores an address or identifier of a target memory bank 104 at index register(s) 114, and the array command specifies the operation to perform on the target memory bank 104. Because multiple host commands are employed for an array access, an effective read or write speed to each of memory banks 104 can be slower than when a single host command results in execution of the array access. Depending on programming and operational routines, this can slow down the effective read or write speeds of two-terminal memory 106 by a small amount. For example, where a native write speed of two-terminal memory 106 is 1.6 µs, the multiple host commands may result in an effective write speed of about 1.8 or 1.9 µs, as one illustrative example. However, the inventor(s) suspects that greater than 2 GB/s of throughput can be achieved in response to interleaving 5 memory banks (for reading) or 20 memory banks (for writing), and even approaching the 3.2 GB/s speed by increasing these numbers of interleaved memory bank operations. Even with the reduced effective read and write speeds, the data throughputs are substantially larger than conventional non-volatile storage devices. Moreover, this high performance can be achieved utilizing existing standard interfaces (e.g., LPDDR3, LPDDR4), minimizing overhead involved in operating with other electronic devices. In some embodiments, disclosed memory devices can operate in a plug-and-play fashion with an LPDDR memory controller. In other embodiments, a software or firmware update to the LPDDR memory controller is sufficient to facilitate the plug-and-play interoperability with one or more disclosed memory devices. Memory device 100, in its various embodiments, is therefore expected to facilitate significant improvement over existing non-volatile memory.

Figure 2:
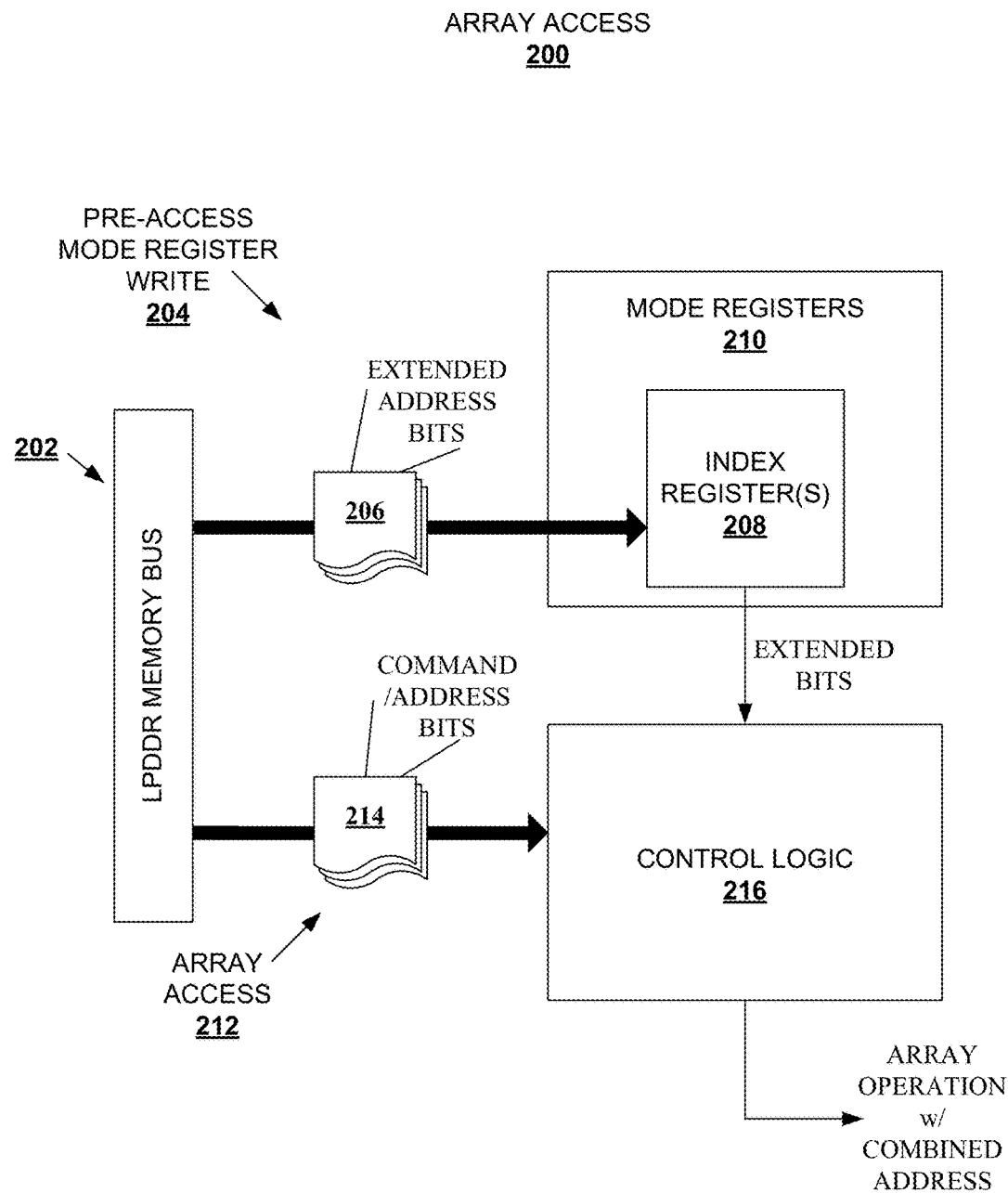
FIG. 2 depicts a block diagram of a sample array access operation providing an expanded address space for a standard bus, in further embodiments.

FIG. 2 illustrates a block diagram of an example array access 200 operation according to various embodiments of the present disclosure. Array access 200 can be received over an LPDDR memory bus 202, which can be an LPDDR3 bus, an LPDDR4 bus, or a near-standard bus (e.g., having a software or firmware modification consistent with hardware requirements of an LPDDR standard). Array access 200 comprises a pre-access mode register write 204 and an array access command 212. Pre-access mode register write 204 includes an address of an index register(s) 208 of a set of mode registers 210, and information to be written to index register(s) 208. The information can comprise a set of extended address bits 206, utilized to increase effective addressing capacity of LPDDR memory bus 202. Set of extended address bits 206 can provide an address of a memory bank of a set of memory banks, in one example. In another example, set of extended address bits 206 can provide an address of one of mode registers 210. In still other embodiments, extended address bits 206 can provide a combination of the foregoing.

Array access 212 can include command and address bits 214 to identify an operation associated with array access 212. Control logic 216 can be configured to read data from these command and address bits 214 to determine what that operation is. In some embodiments, command and address bits 214 can include additional identifier information for identifying a target memory bank for the operation, in combination with extended address bits 206. Control logic 216 can be configured to decode an address of a target memory bank (or target mode register, etc.), utilizing extended address bits 206, and in some embodiments command and address bits 214. For instance, extended address bits 206 can exclusively convey the address of the target memory bank (or mode register) in some embodiments, whereas in other embodiments, the data identifying the target memory bank (or mode register) can be interleaved among extended address bits 206 and command and address bits 214. Control logic 216 can output the address for the target memory bank, and the array operation to be performed on the target memory bank.

Figure 3:
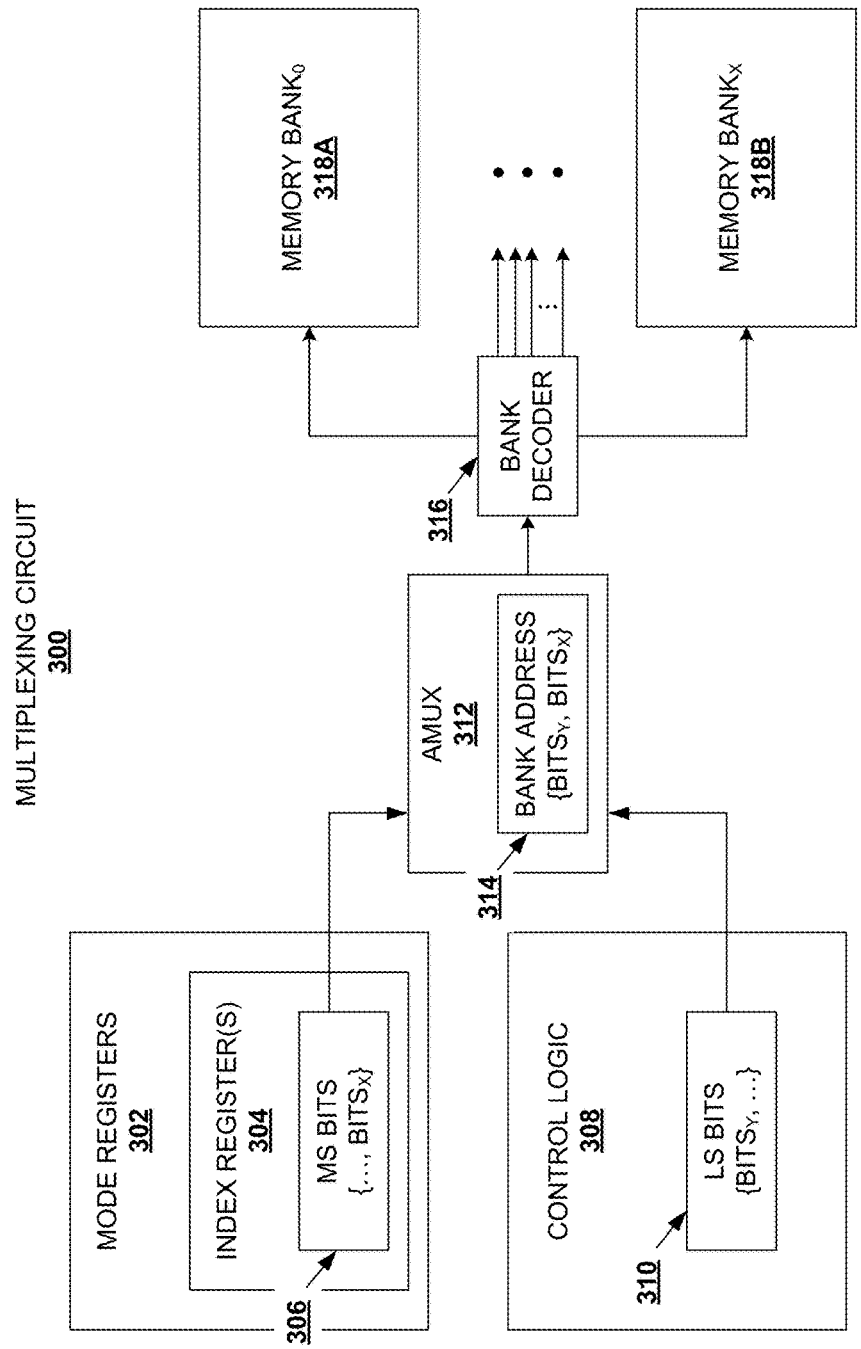
FIG. 3 illustrates a block diagram of a sample multiplexing circuit for combining standard and extended addressing space for a memory array operation.

FIG. 3 illustrates a block diagram of a multiplexing circuit 300 configured to decode an address of a memory bank (or a subset of memory banks), of a multi-bank memory device, in further embodiments. Multiplexing circuit 300 can comprise a set of mode registers 302, including an index register(s) 304. Index register(s) 304 can comprise a number of bits to facilitate an extended address space for a command and address protocol. In some embodiments, index register(s) 304 can identify a target memory bank, whereas command information can identify a target subset of memory (e.g., a page, a block, a word, a byte, etc.) within the target memory bank. In additional embodiments, index register(s) 304 can identify a subset of an address of the target memory bank, and additional bits included with the command information can complete the address.

For the former embodiments, an identifier of a target memory bank can be written to index register(s) 304, and an address for a subset of the target memory bank can be received by control logic 308 from an array operation (e.g., an array write, an array read, etc.). In this embodiment, the identifier can be provided to a bank decoder 316 that determines one of a set of multiple memory banks from the identifier, including memory bank$_0$ 318A, . . . , memory bank$_X$ 318B (referred to collectively as memory banks 318A-318B), where X is a suitable number greater than one (e.g., 2, 4, 8, 16, 32, 64, 128, 256, 512, 1024, 2048, 4096, 8192, . . . , memory banks). In at least one embodiment, index register(s) 304 is an 8-bit register that can distinguish 256 memory banks (or individually addressable subsets of memory banks). For larger than 256 memory banks, two (or more) index registers 304 can be employed to expand the memory bank address space to a 16-bit (or larger) address. In such case, a first index register 304 could store 8 least significant bits and a second index register 304 could store 8 most significant bits of the 16-bit address, and amux 312 can combine the respective 8-bit codes to decode a 16-bit (or larger) address. The address for the subset of the target memory bank can be decoded by address multiplexer (amux) 312 into a row address and a column address for the subset of the target memory bank. The operation can then be performed on the subset of memory within the target memory bank.

In the second embodiment, a first subset of a target memory bank address (e.g., most significant bits, or MS bits) is written to the extended address space 306 of index register(s) 304. A second subset of the target memory bank address (e.g., least significant bits 310, or LS bits) can be provided with an array command and received by control logic 308. Amux 312 can combine the first subset with the second subset to decode a bank address 314, comprising the most significant bits and least significant bits, for instance. Bank address 314 can be provided to bank decoder 316, which identifies one (or more) of memory banks 318A-318B identified by bank address 314. In the second embodiment, row address and column address information of the target memory bank(s) can be provided with the array command; or in at least one embodiment, some or all of the row address and column address information can be interleaved into the extended address space 306 or least significant bits 310 provided with the array command.

Figure 4:
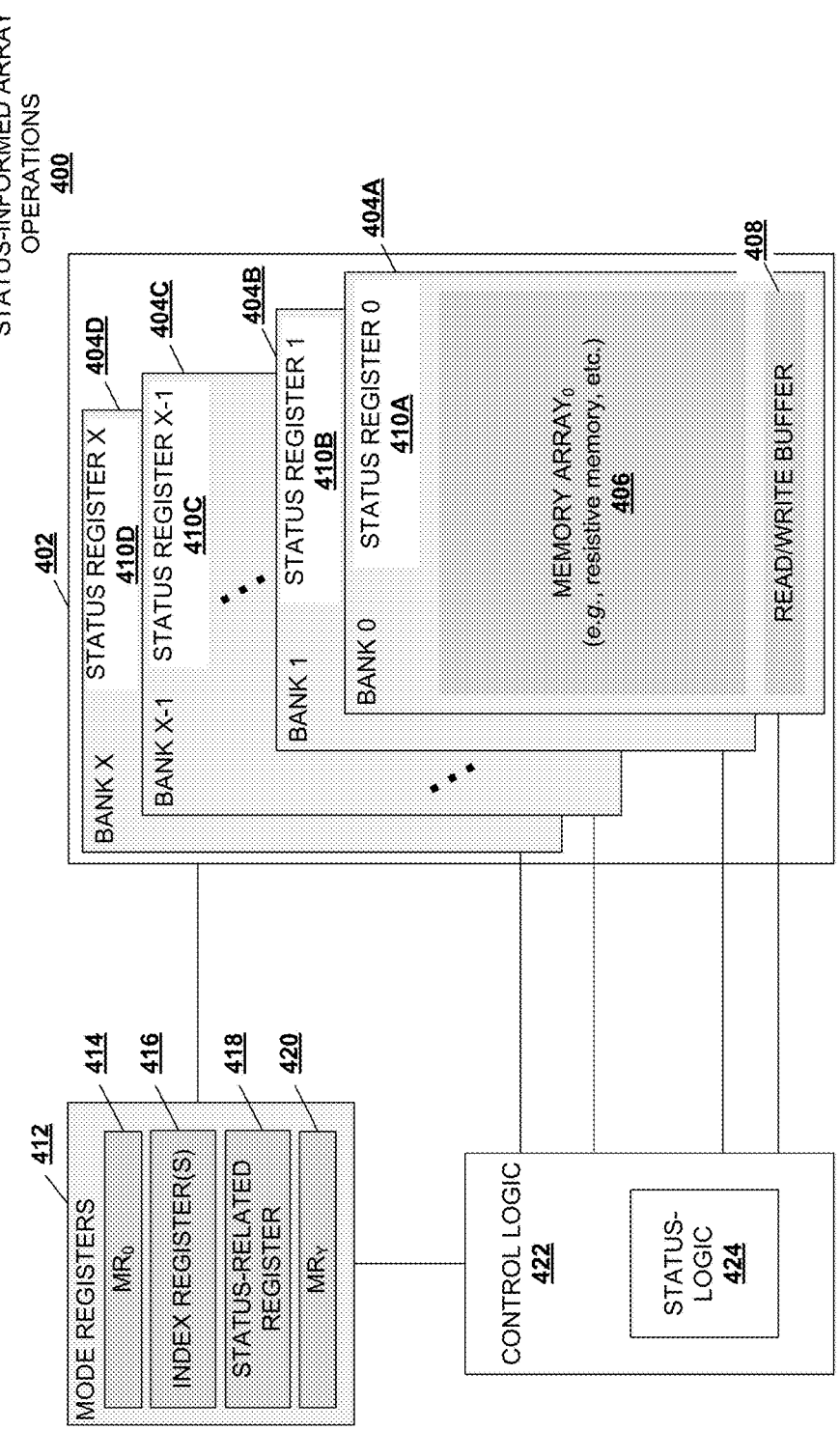
FIG. 4 depicts a block diagram of an example multi-bank memory with expanded address space and bank-specific status information, in a further embodiment.

FIG. 4 illustrates a block diagram of a memory device configured to implement status-informed array operations 400, according to further embodiments. The memory device can comprise a memory chip 402 having a plurality of memory banks, including memory bank$_0$ 404A, memory bank$_1$ 404B, . . . , memory bank$_{X-1}$ 404C, memory bank$_X$ 404D (referred to collectively as memory banks 404A-404D). Respective memory banks can comprise a memory array 406 (e.g., two-terminal, resistive switching memory, and so forth), and a read/write buffer 408. Additionally, respective memory banks 404A-404D can comprise a status register, including status register$_0$ 410A, status register$_1$ 410B, . . . , status register$_{X-1}$ 410C, status register$_X$ 410D (referred to collectively as status registers 410A-410D). The memory device can additionally comprise a set of mode registers 412 and control logic 422 for performing operations of the memory device.

Mode registers 412 include mode register$_0$ 414 through mode register$_Y$ 420, where Y can be a suitable number greater than two. One or more index registers 416 can be provided with mode registers 412, configured to expand an address space of a communication protocol employed by the memory device. In addition, mode registers 412 can include a status-related register 418 to facilitate generating, and outputting status information from status registers 410A-410D. The status information can be utilized to inform array operations, resulting in status-informed array operations 400 that exhibit improved performance and efficacy compared with array operations that do not have the benefit of status information. As one example, without the availability of status information, a set of array operations received from a host device (e.g., computer, memory controller, etc.) and interleaved by control logic 422 among a plurality of memory banks 404A-404D would all have to complete before bank-specific results for the set of array operations can be obtained, and specific error information acquired. In contrast, status logic 424 of control logic 422 can be configured to output status-related information prior to completion of the set of array operations. Status information could include idle/busy status for one or more banks, allowing the host device to issue additional array commands as long as one memory bank is idle. The status information could also include program or write error information, or error correction code (ECC) information, potentially enabling the host device to initiate error correction routines while the set of array operations are still pending.

A status-related command can be issued by writing data to status-related register 418 (e.g., via a mode register write command targeting status-related register 418). In various embodiments, index register(s) 416 can be employed to expand an address space of memory chip 402. The expanded address space can be employed to identify respective memory banks 404A-404D (or subsets of memory banks 404A-404D) for the status-related command. Accordingly, the status-related command can, in addition to the status-related command to status-related register 418, comprise a mode register write to index register(s) 416, to write an identifier for a target memory bank(s) 404A-404D. Of course, for multiple operations targeting a single memory bank identifier (e.g., the same memory bank 404A-404D or subset of memory banks), the index register write command need not be repeated, as control logic 422 can re-acquire the identifier from index register 416 (or store the identifier in a cache memory—not depicted).

In at least one embodiment, index register(s) 416 can be configured to store identifier information indicative of a range of status registers 410A-410D. In such embodiments, status logic 424 can aggregate status information pertinent to the range of status registers 410A-410D, and output the status information in reply to a status command. As an example, a host could specify the first ten status registers of status registers 410A-410D in index register 416, and write program error command code to status-related register 418, causing status logic 424 to obtain program error status for the first ten status registers of status registers 410A-410D, and output aggregate status information (e.g., whether any of those ten status registers recorded a program error) for those first ten status registers. Other ranges of status registers (e.g., last ten status registers, first three status registers, a range of status registers from status register$_A$-status register$_B$, where A is 0 or larger, and B is larger than 1, and so forth) can be specified instead. In some embodiments, unassigned command and address bus bits associated with a mode register command targeting status-related register 418 can be employed, in part, to specify the range of status registers. For instance, in at least one embodiment, a starting status register address can be written to index register(s) 416, and an ending status register address can be provided in un-assigned bits of a status-read command targeting status-related register 418, as one example.

Figure 5:
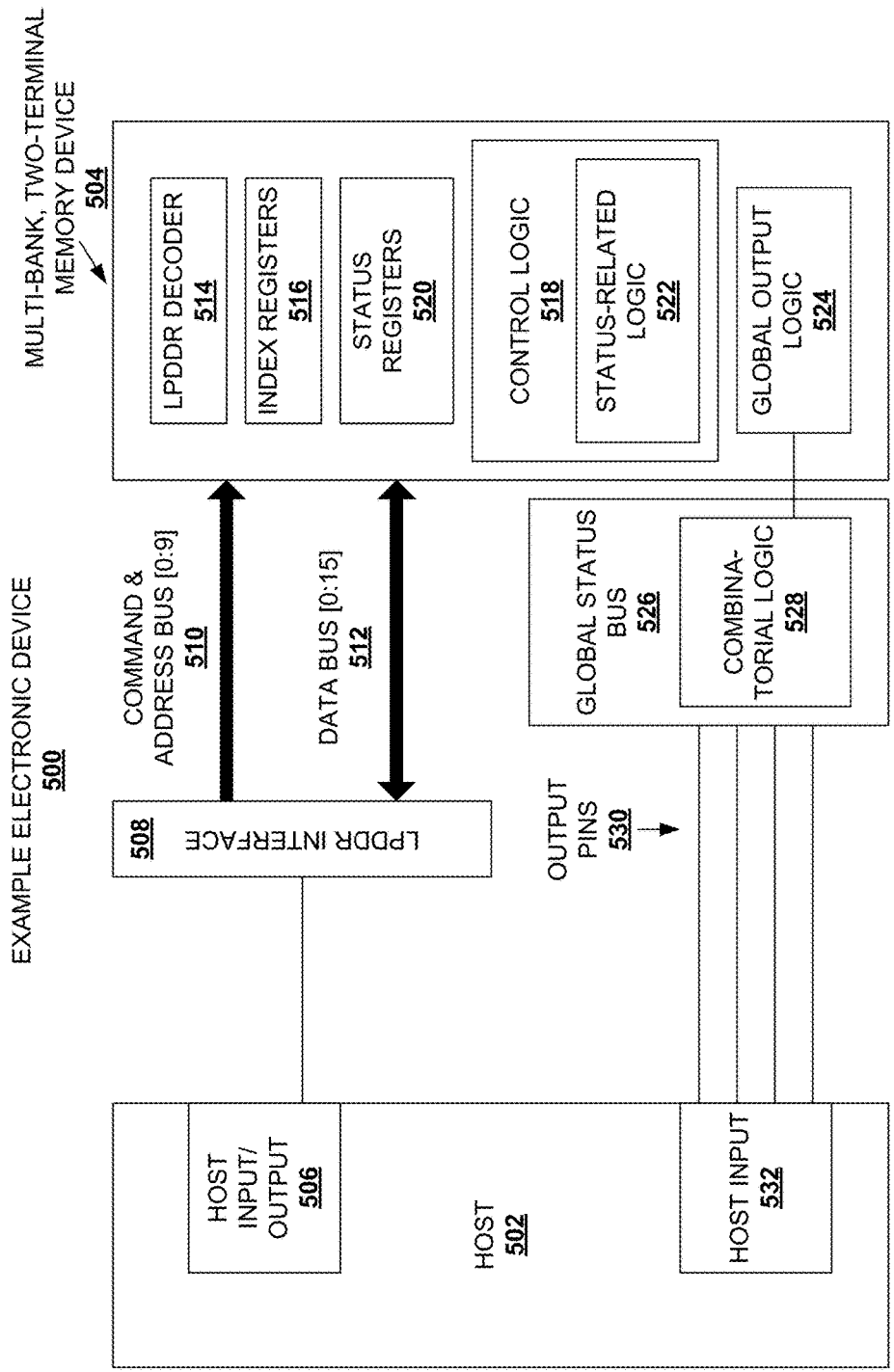
FIG. 5 illustrates a block diagram of a sample electronic device configured to utilize status information to inform array operations, in an embodiment(s)

FIG. 5 illustrates a block diagram of an example electronic device 500 employing a disclosed memory system, according to additional embodiments of the present disclosure. In some embodiments, electronic device 500 can be a standalone device, such as a computer, tablet computer, smart-phone, electronic gaming device, wearable device, and so forth. In other embodiments, electronic device 500 can be a removable memory card, or memory module, an embedded memory, or other suitable memory device.

Electronic device 500 can comprise a host device 502 and a multi-bank, two-terminal memory device 504. Host 502 can be a memory controller, in some embodiments, or can be a computer or other processing device comprising a suitable memory controller, in other embodiments. Host 502 can comprise a host input/output 506 for issuing commands and providing data to memory device 504. The commands and data are transferred over an LPDDR interface 508 to memory device 504, and returns data from memory device 504 to host input/output 506. Particularly, LPDDR interface 508 can comprise a command and address bus 510 to transfer command information to memory device 504, and a data bus 512 to transfer data to memory device 504, or from memory device 504 to host 502. In some embodiments, command and address bus 510 can be a double data rate, 10-pin bus, transferring 20 bits of data per clock cycle. Data bus 512 can be selected from a range of sizes, matching a desired bus width. Thus, data bus 512 is depicted as being a (double data rate) 16-pin bus, though 24-pin, 32-pin, 40-pin, etc., data bus sizes can be provided as well.

Memory device 504 can comprise an LPDDR decoder to convert code values transmitted on command and address bus 510 into associated memory operation(s). One or more index registers 516 can store data values associated with an extended address space for memory device 504. The extended address space can facilitate an addressing mechanism to identify subsets of independently-operable memory banks for multi-bank, two-terminal memory device 504, identify subsets of status registers 520 associated with respective memory bank(s), identify one or more mode registers of memory device 504, or other suitable components thereof. Data values can be written to index register(s) 516 utilizing a mode register write command, as described herein.

Memory device 504 can comprise control logic 518 configured to implement operations identified by LPDDR decoder 514. These operations can include array operations (e.g., array read, array write, etc.), mode register operations, configuration operations (e.g., see FIG. 7, infra), maintenance operations (e.g., ECC, error correction, garbage collection, and so on), and so on. Control logic 518 can comprise a set of status-related logic 522 to manage status-related operations. In some embodiments, LPDDR decoder 514 can be configured to identify status-related operations received at memory device 504, which are carried out by status-related logic 522. In other embodiments, status-related logic 522 can be configured to receive status command codes, translate status command codes into status operations, and carry out the status operations. Status operations can include track status of one or more memory banks, output status information for one or more memory banks (e.g., idle/busy status, program/write fail status, ECC status, etc.), output aggregate status information for a set of memory banks, or the like.

In addition to the foregoing, memory device 504 can comprise global output logic 524. Global output logic 524 provides status information pertinent to all memory banks of memory device 504 (e.g., see FIG. 6, infra). The global status information can be output by a global output bus 526, where combinatorial logic 528 aggregates types or functions of global status information for each of the memory banks, and outputs respective types of aggregated status information on respective ones of output pins 530. Aggregation of global status information, example types of status information and output are described in more detail at FIG. 6, infra.

Figure 6:
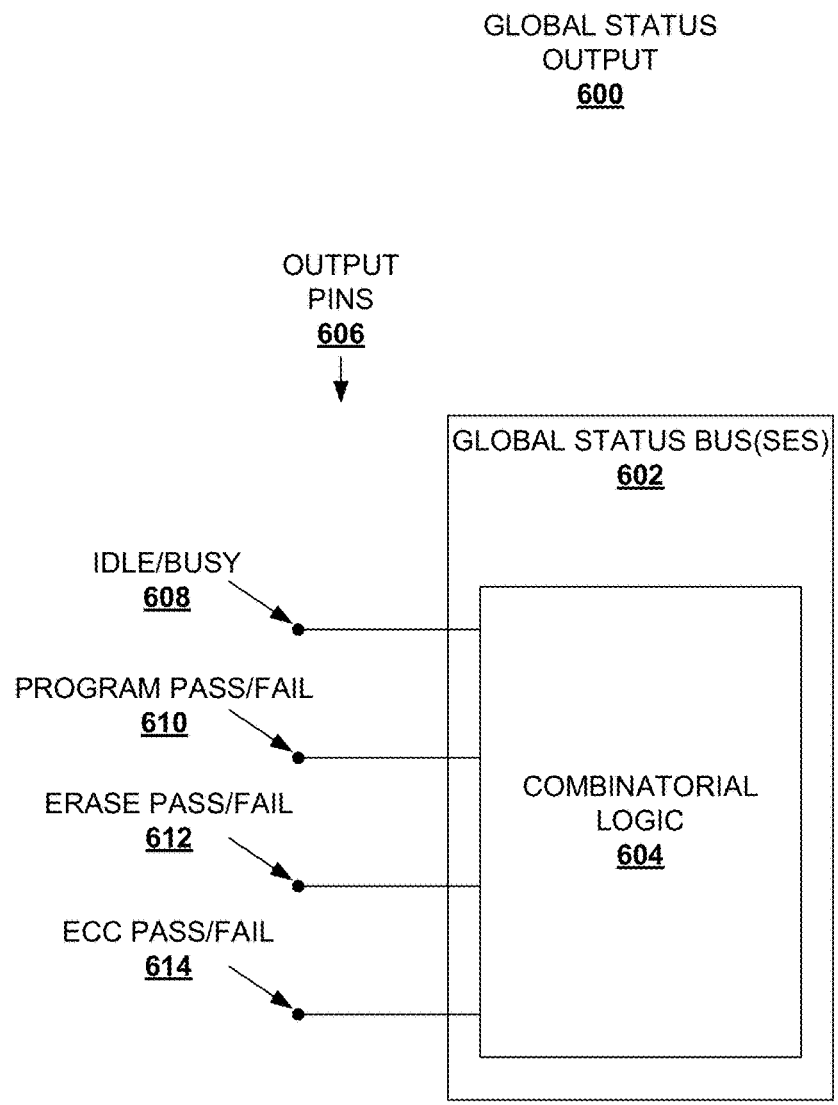
FIG. 6 depicts a block diagram of an example global status output for a multi-bank memory, in one or more embodiments.

FIG. 6 depicts a block diagram of an example global status output component 600 for a memory device, according to further embodiments of the present disclosure. Global status output component 600 comprises one or more global status busses 602. Combinatorial logic 604 can receive status information for respective memory banks of a memory device, and aggregate the respective status information into global status information pertinent to all of the memory banks. As one example, combinatorial logic 604 can be an OR logic, that outputs a first global status state (e.g., busy state) in response to all status information of respective memory banks being in a first state (e.g., busy state), and outputs a second global status state (e.g., idle state) in response to any status information of the respective memory banks being in a second state (e.g., idle state).

Aggregated status information can be output from global status bus(ses) 602 on one of a set of output pins 606. Output pins 606 can comprise an idle/busy pin 608, a program pass/fail pin 610, an erase pass/fail pin 612 and an ECC pass/fail pin 614, in some embodiments. Another set of status pins, including additional pins, can be provided in other embodiments. The global status information can be provided to a host to inform further host-memory operations. For instance, global busy/idle information could be utilized to inform further array operations (e.g., by assigning array operations to idle memory banks), and pass/fail information could be utilized to inform maintenance operations (e.g., error correction, and the like), in various embodiments. In at least one embodiment, a signal presented on one of output pins 606 can be configured to interrupt a host. The interrupt can occur in response to a change in the signal (e.g., from low to high, etc.), in some embodiments, or in response to the signal itself (e.g., no signal to high, no signal to low, etc.), in other embodiments.

Figure 7:
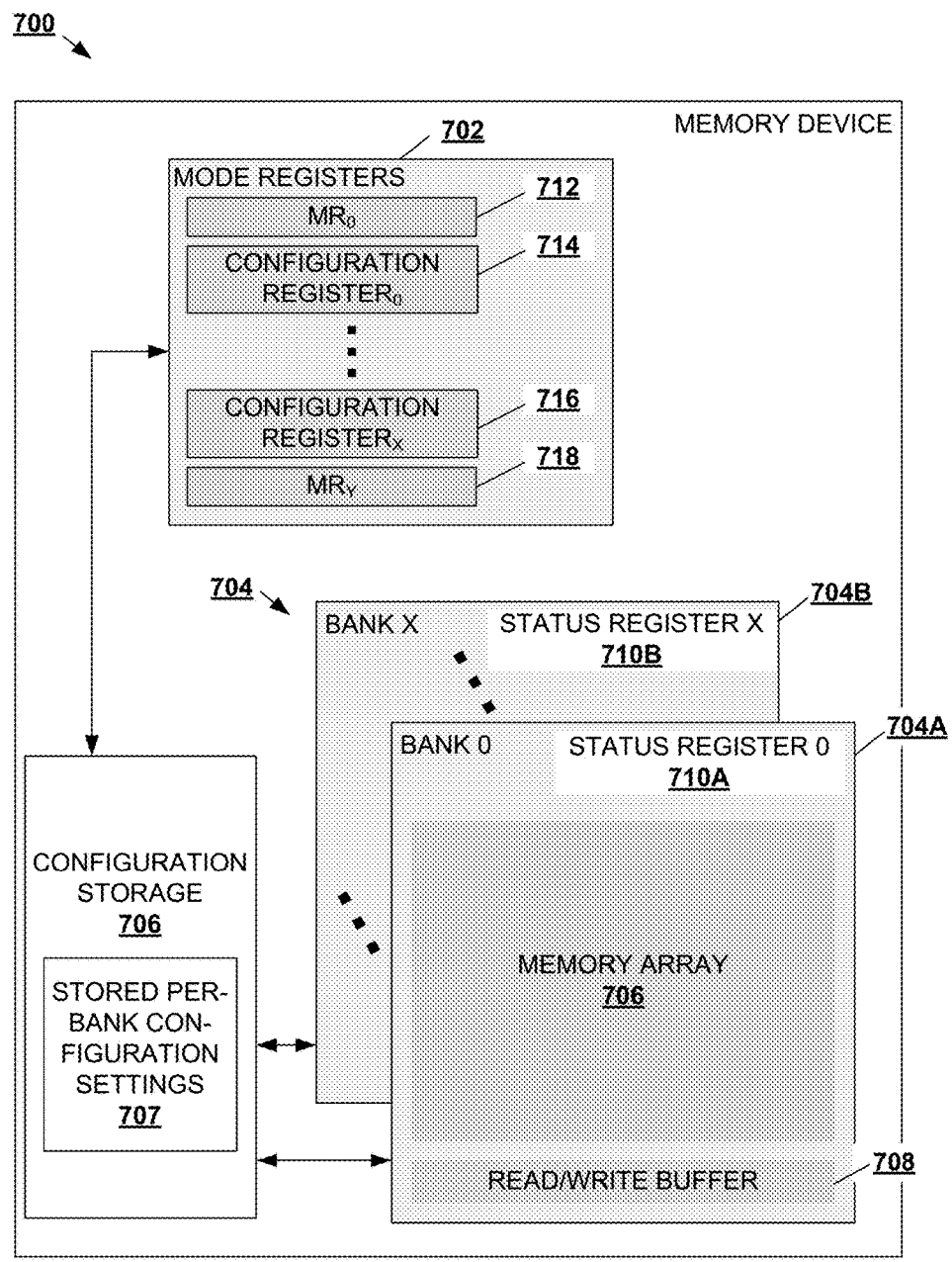
FIG. 7 illustrates a block diagram of a sample multi-bank memory having bank-specific configurability in alternative or additional embodiments.

FIG. 7 depicts a block diagram of an example memory device 700 according to further embodiments of the present disclosure. Memory device 700 can facilitate separate configurations for respective memory banks of memory device 700, or respective groups of memory banks. In some embodiments, memory device 700 can incorporate features of electronic device 500, facilitating bank-specific configurations as well as bank-specific (and global) status information, though the subject disclosure is not limited to these embodiments.

Memory device 700 comprises a set of mode registers 702 and multiple memory banks, including memory bank$_0$ 704A through memory bank$_X$ 704B (referred to collectively as memory banks 704A-704B). Each of memory banks 704A-704B can comprise a memory array 706 of two-terminal memory (e.g., a resistive-switching memory array, etc.) and a read-write buffer 708. Additionally, memory banks 704A-704B can comprise respective status registers, including status register$_0$ 710A through status register$_X$ 710B (referred to collectively as status registers 710A-710B).

Mode registers 702 facilitate operational control over memory device 700. The mode registers 702 can comprise permanent and programmable settings for various memory banks 704A-704B, status registers 710A-710B, and other components of memory device 700. Some of the mode registers 702 can be read only devices programmed to an initial, fixed setting (e.g., post-fabrication, or post-shipment). Other mode registers can store programmable codes, values, etc., that can be read, erased and written in response to mode register commands received by memory device 700. As an example, mode registers 702 can comprise one or more configuration registers that facilitate programmable configurations for respective memory banks 704A-704B, or subsets of memory banks 704A-704B.

Mode registers 702 include a number, Y, of mode registers, from mode register$_0$ 712 through mode register$_Y$ 718, where Y is a suitable integer greater than 2. A subset of mode registers 702 include configuration registers, depicted as configuration register$_0$ 714 through configuration register$_X$ 716 (collectively referred to as configuration register(s) 714-716), where X is a suitable integer greater than zero. Configuration register(s) 714-716 can be utilized to individually program different subsets of memory banks 704A-704B according to different configuration states. Configuration commands can be written to (or read from) configuration register(s) 714-716. The configuration commands can include an address or identifier for a target subset of memory banks 704A-704B, and a command value (e.g., a configuration code) identifying one or more configuration states for the target subset of memory banks 704A-704B. Further, different configuration commands can target different subsets of memory banks 704A-704B and program the different subsets to different configuration states. In various embodiments, suitable configuration states can include a single level cell state (SLC—storing a single bit of information) or multi-level cell state (MLC—storing multiple bits of information), enabling some memory banks to be configured as SLC memory banks and others to be configured as MLC memory banks. Other suitable configuration states can include selected hardware parameter values, such as clock speed(s), program voltage, read voltage, program latency, read latency, or the like, or suitable combinations of the foregoing. Still other suitable configuration states can include a set of software states, a set of logic states, or the like, with which individual memory banks can be configured to operate according to one (or more) of the set of software states or the set of logic states, etc.

In various embodiments, memory device 700 can provide significant flexibility to serve a diverse set of needs in the electronic memory space. As mentioned above, memory device 700 can comprise some memory banks 704A-704B configured for MLC memory arrays 706, to serve a need for relatively high memory density, and other memory banks 704A-704B configured for SLC memory array 706, to serve a need for relatively high performance, reliability or longevity memory storage. Other examples can include a first set of memory banks 704A-704B configured with relatively high operation voltage to achieve low latency, and a second set of memory banks 704A-704B configured with relatively low operation voltage and higher latency to achieve lower power consumption. Applications configured for better performance and low latency can utilize the first set of memory banks 704A-704B, whereas applications configured for low power consumption can utilize the second set of memory banks 704A-704B.

In some embodiments, memory device 700 can comprise configuration storage 706 that maintains configuration settings of memory banks 704A-704B. The configuration storage 706 can be separate from memory banks 704A-704B, in some embodiments, or can be respectively stored in a subset of memory banks 704A-704B in other embodiments. Configuration storage 706 can include stored per-bank configuration settings 707 that govern hardware, firmware or software configurations for respective ones of memory banks 704. Stored per-bank configuration settings 707 can be read, written or overwritten, to acquire or change configuration settings for memory banks 704.

The aforementioned diagrams have been described with respect to interaction between several components of an electronic device, a host, an interface, or memory architecture. It should be appreciated that in some suitable alternative aspects of the subject disclosure, such diagrams can include those components, devices, architectures, etc., specified therein, some of the specified components/devices/architectures, or additional components/devices/architectures. Sub-components can also be implemented as connected to other sub-components rather than included within a parent component. For example, multiple memory banks can be provided on separate memory chips, instead of on a single chip. Additionally, it is noted that one or more disclosed processes can be combined into a single process providing aggregate functionality. Components of the disclosed devices/architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 8-11. While for purposes of simplicity of explanation, the methods of FIGS. 8-11 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 8:
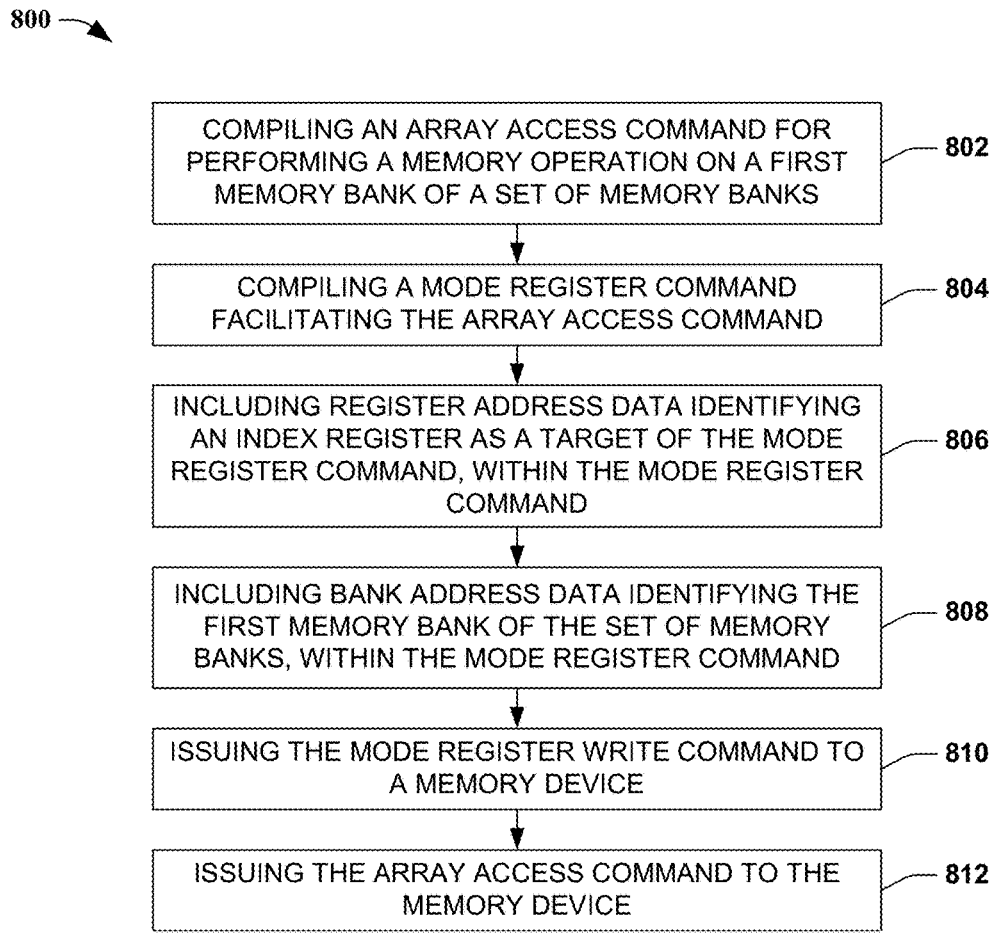
FIG. 8 depicts a flowchart of a sample method for operating a multi-bank memory over a standard (or near-standard) bus with extended addressing.

FIG. 8 illustrates a flowchart of a sample method 800 for operating a memory device, according to additional embodiments of the present disclosure. At 802, method 800 can comprise compiling an array access command for performing a memory operation on a first memory bank of a set of memory banks of the memory device. At 804, method 800 can comprise compiling a mode register write command that facilitates the array access command. At 806, method 800 can comprise including in the mode register write command a register address identifying an index register of a set of mode registers of the memory device as a target of the mode register write command. At 808, method 800 can comprise including in the mode register write command a set of bank address data identifying the first memory bank of the set of memory banks. Further, the bank address data is to be written by the memory device to the index register in conjunction with execution of the mode register write command. At 810, method 800 can comprise issuing the mode register write command to the memory device. At 812, method 800 can comprise issuing the array access command to the memory device.

In one or more additional embodiments, method 800 can additionally comprise compiling a second array access command for performing a second memory operation on a second memory bank of the memory device. Further, method 800 can comprise compiling a second mode register write command to facilitate execution of the second array access command. Compiling the second mode register write command can further comprise including the register address data identifying the index register as the target of the second mode register write command, and including second bank address data identifying the second memory bank. The second bank address data can be written by the memory device to the index register in response to receiving and decoding the second mode register write command, and in conjunction with execution of the second mode register write command. Moreover, the method can comprise issuing the second mode register write command and issuing the second array access command to the memory device.

In one or more additional embodiments, method 800 can comprise compiling a status register read command for obtaining status information for a first status register associated with the first memory bank. Furthermore, method 800 can comprise compiling a third mode register write command to facilitate the status register read command. Particularly, compiling the third mode register write command can also comprise including the register address data identifying the index register as the target of the third mode register write command within the third mode register write command, and including status address data identifying the first status register within the mode register write command. In response to receiving the third mode register write command, the memory device can write the status address data to the index register in conjunction with executing the third mode register write command. The method 800 can then comprise issuing the third mode register write command to the memory device, and issuing the status register read command to the memory device.

In at least one alternative or additional embodiment, method 800 can comprise compiling a status register read command for obtaining status information for the first status register associated with the first memory bank. In one embodiment, the first status register is accessed with the bank address data identifying the first memory bank, and compiling the status register read command further comprises including the bank address data identifying the first memory bank within the status register read command. In an alternative embodiment, the first status register is accessed with first status register identifier data (e.g., unique to the first status register, or a first subset of status registers), and in the latter embodiment compiling the status register read command can further comprise including the first status register identifier data within the status register read command. Method 800 can further comprise issuing the status register read command to the memory device.

Additionally, method 800 can comprise receiving the status information for the first status register in response to issuing the status register read command. In one or more embodiments, method 800 can comprise determining from the status information at least one of: a busy or idle status, a pass or fail status, or an ECC failure status for the first memory bank. Method 800 can additionally comprise at least one of: issuing a second array access command for the first memory bank in response to determining the idle status for the first memory bank; issuing a failure correction command for correcting the memory operation in response to determining the fail status for the first memory bank; or issuing an ECC command for correcting a bit error associated with the first memory bank in response to determining the ECC status.

Figure 9:
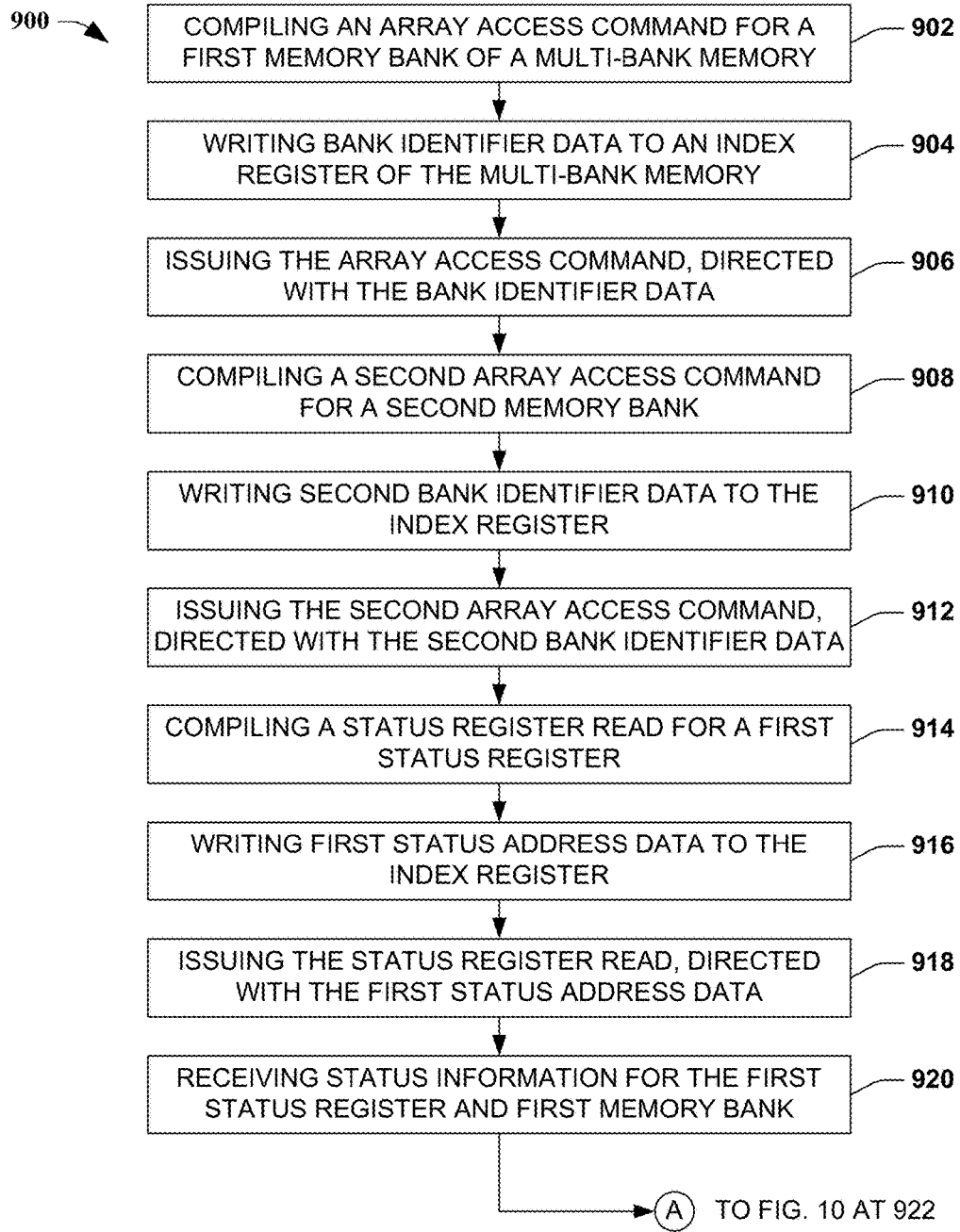
FIGS. 9 and 10 depict a flowchart of an example method for integrating status information to improve duty cycle of a multi-bank memory, in an embodiment(s)
Figure 10:
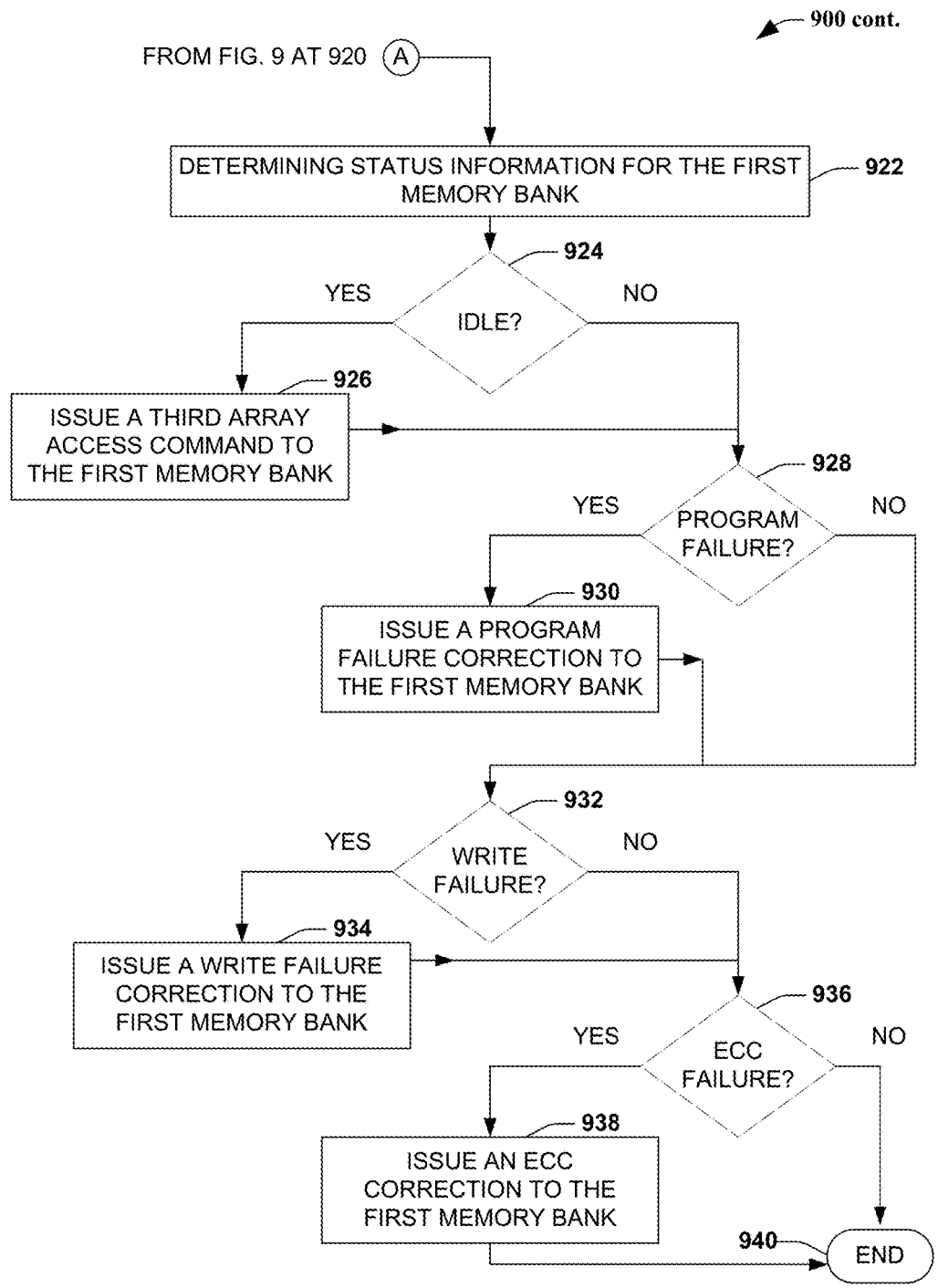

FIG. 9 depicts a flowchart of a sample method 900 according to alternative or additional embodiments of the present disclosure. At 902, method 900 can comprise compiling an array access command for a first memory bank of a multi-bank memory. At 904, method 900 can comprise writing bank identifier data to an index register of the multi-bank memory. At 906, method 900 can comprise issuing the array access command, directed with the bank identifier data.

At 908, method 900 can comprise compiling a second array access command for a second memory bank of the multi-bank memory. At 910, method 900 can comprise writing second bank identifier data to the index register, and at 912, method 900 can comprise issuing the second array access command, directed with the second bank identifier data.

At 914, method 900 can comprise compiling a status register read for a first status register associated with the first memory bank. At 916, method 900 can comprise writing first status address data to the index register. At 918, method 900 can comprise issuing the status register read, directed with the first status address data.

At 920, method 900 can comprise receiving status information for the first status register and the first memory bank. From 920, method 900 continues at 922 on FIG. 10. At 922, method 900 can comprise determining status information for the first memory bank. At 924, a determination is made from the status information whether the first memory bank is in an idle state. If the first memory bank is in the idle state, method 900 proceeds to 926 and further comprises issuing a third array access command to the first memory bank. Otherwise, if the first memory bank is not in the idle state, method 900 can proceed to 928.

At 928, method 900 can comprise determining from the status information whether a program failure has occurred for the first memory bank. If the program failure has occurred for the first memory bank, method 900 can proceed to 930 and further comprise issuing a program failure correction to the first memory bank. Otherwise, if no program failure has occurred, method 900 can proceed to 932.

At 932, method 900 can comprise determining from the status information whether a write failure has occurred for the first memory bank. If the write failure has occurred for the first memory bank, method 900 can proceed to 934 and further comprise issuing a write failure correction to the first memory bank. Otherwise, if no write failure has occurred, method 900 can proceed to 936.

At 936, method 900 can comprise determining from the status information whether an ECC failure has occurred for the first memory bank. If the ECC failure has occurred for the first memory bank, method 900 can proceed to 938 and further comprise issuing an ECC failure correction to the first memory bank, and end at 940. Otherwise, if no ECC failure has occurred, method 900 can proceed to 940 and end.

Figure 11:
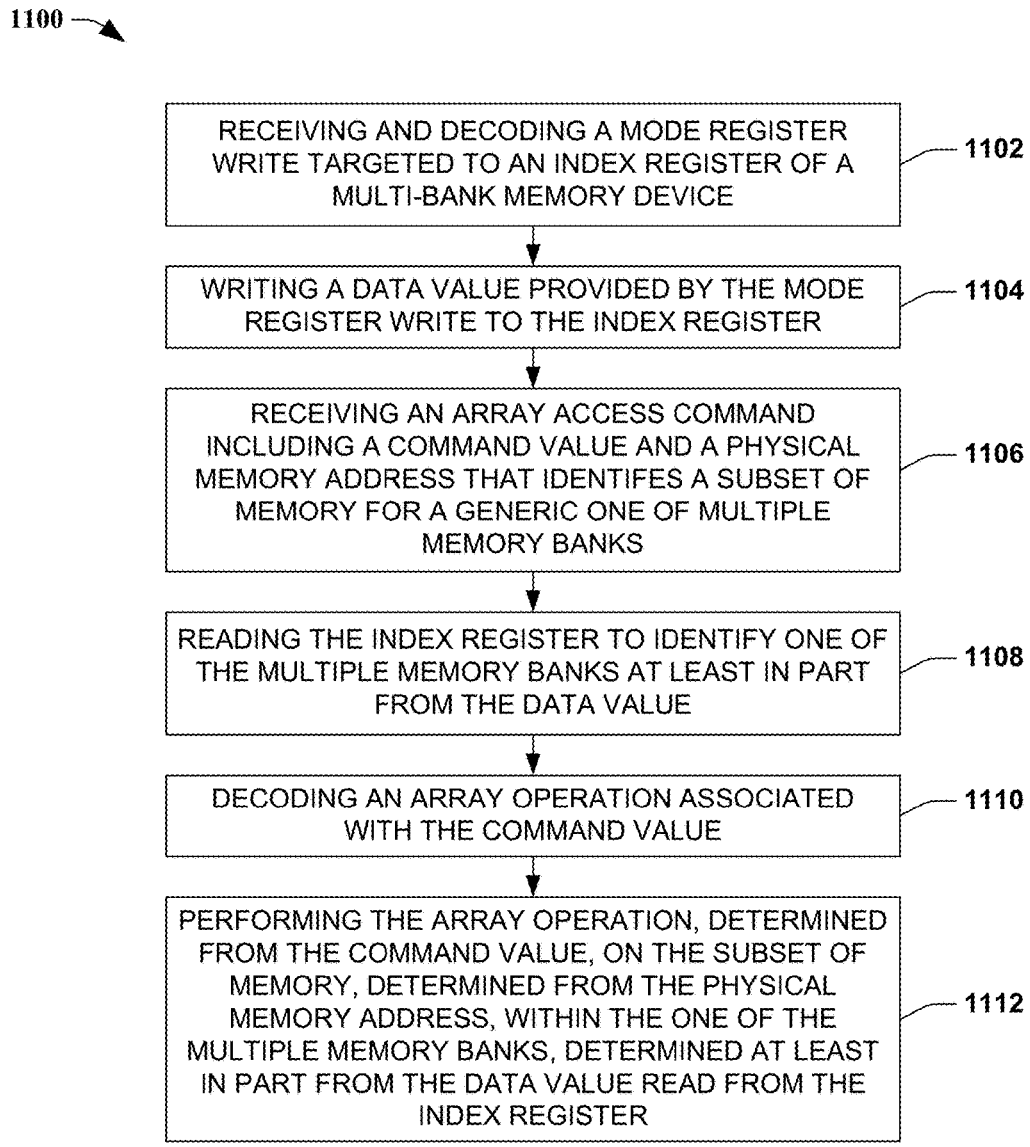
FIG. 11 illustrates a flowchart of a sample method for managing array operations of a multi-bank memory with a standard communication protocol.

FIG. 11 illustrates a flowchart of a sample method 1100 for operating a multi-bank memory device comprising non-volatile, two-terminal memory and utilizing an LPDDR interface, according to further disclosed embodiments. At 1102, method 1100 can comprise receiving and decoding a mode register write targeted to an index register of the multi-bank memory device. At 1104, method 1100 can comprise writing a data value provided by the mode register write to the index register. At 1106, method 1100 can additionally comprise receiving an array access command including a command value and a physical memory address that identifies a subset of memory for a generic one of multiple memory banks. At 1108, method 1100 can comprise reading the index register to identify one of the multiple memory banks at least in part from the data value. At 1110, method 1100 can comprise decoding an array operation associated with the command value. Moreover, at 1112, method 1100 can comprise performing the array operation, determined from the command value, on the subset of memory, determined from the physical memory address, within the one of the multiple memory banks, determined at least in part from the data value read from the index register.

Figure 12:
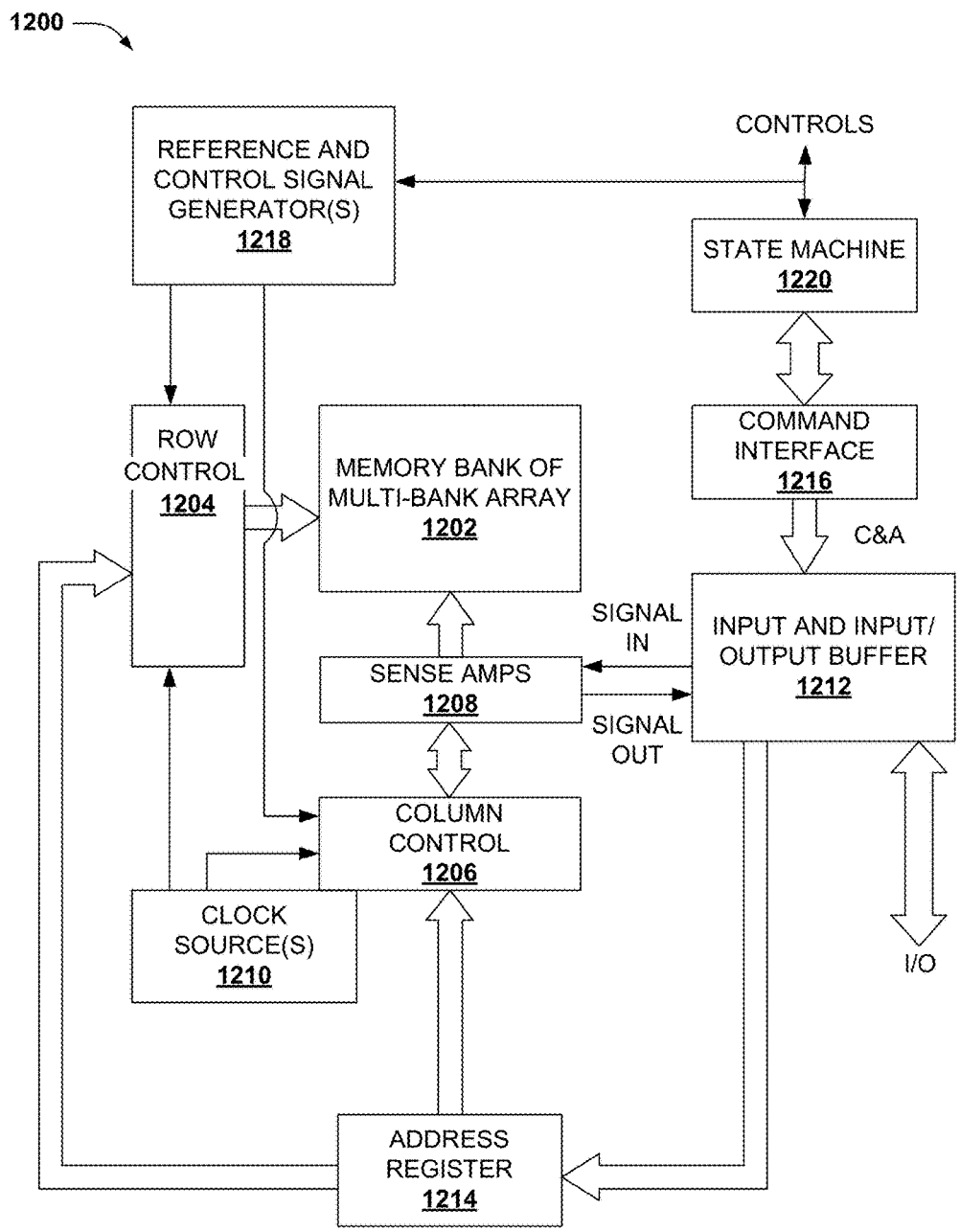
FIG. 12 depicts a block diagram of an example operating and control environment for a memory device according to disclosed embodiments.

FIG. 12 illustrates a block diagram of an example operating and control environment 1200 for a memory bank 1202 of a multi-bank memory cell array according to aspects of the subject disclosure. In at least one aspect of the subject disclosure, memory bank 1202 can comprise memory selected from a variety of memory cell technologies. In at least one embodiment, memory bank 1202 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, memory bank 1202 can comprise a status register (not depicted—but see FIG. 4, infra) configured to generate and output status information pertinent to memory bank 1202. In yet another embodiment, memory bank 1202 can be configured to operate according to a first set of configurations (e.g., MLC, SLC, operation voltage, clock speed, latency, etc.) that is at least in part different from a second set of configurations of a second memory bank of the multi-bank array of memory.

A column controller 1206 and sense amps 1208 can be formed adjacent to memory bank 1202. Moreover, column controller 1206 can be configured to activate (or identify for activation) a subset of bit lines of memory bank 1202. Column controller 1206 can utilize a control signal provided by a reference and control signal generator(s) 1218 to activate, as well as operate upon, respective ones of the subset of bitlines, applying suitable program, erase or read voltages to those bitlines. Non-activated bitlines can be kept at an inhibit voltage (also applied by reference and control signal generator(s) 1218), to mitigate or avoid bit-disturb effects on these non-activated bitlines.

In addition, operating and control environment 1200 can comprise a row controller 1204. Row controller 1204 can be formed adjacent to and electrically connected with word lines of memory bank 1202. Also utilizing control signals of reference and control signal generator(s) 1218, row controller 1204 can select particular rows of memory cells with a suitable selection voltage. Moreover, row controller 1204 can facilitate program, erase or read operations by applying suitable voltages at selected word lines.

Sense amps 1208 can read data from, or write data to the activated memory cells of memory bank 1202, which are selected by column control 1206 and row control 1204. Data read out from memory bank 1202 can be provided to an input and input/output buffer 1212 (e.g., an LPDDR buffer, in some embodiments). Likewise, data to be written to memory bank 1202 can be received from the input and input/output buffer 1212 and written to the activated memory cells of memory bank 1202.

A clock source(s) 1208 can provide respective clock pulses to facilitate timing for read, write, and program operations of row controller 1204 and column controller 1206. Clock source(s) 1208 can further facilitate selection of word lines or bit lines in response to external or internal commands received by operating and control environment 1200. Input and input/output buffer can comprise a command and address input, as well as a bidirectional data input and output. Instructions are provided over the command and address input, and the data to be written to memory bank 1202 as well as data read from memory bank 1202 is conveyed on the bidirectional data input and output, facilitating connection to an external host apparatus, such as a computer or other processing device (not depicted, but see e.g., computer 1302 of FIG. 13, infra).

Input and input/output buffer 1212 can be configured to receive write data, receive an erase instruction, receive a status or maintenance instruction, output readout data, output status information, and receive address data and command data, as well as address data for respective instructions. Address data can be transferred to row controller 1204 and column controller 1206 by an address register 1210. In addition, input data is transmitted to memory bank 1202 via signal input lines between sense amps 1208 and input and input/output buffer 1212, and output data is received from memory bank 1202 via signal output lines from sense amps 1208 to input and input/output buffer 1212. Input data can be received from the host apparatus, and output data can be delivered to the host apparatus via the I/O bus.

Commands received from the host apparatus can be provided to a command interface 1216. Command interface 1216 can be configured to receive external control signals from the host apparatus, and determine whether data input to the input and input/output buffer 1212 is write data, a command, or an address. Input commands can be transferred to a state machine 1220.

State machine 1220 can be configured to manage programming and reprogramming of memory bank 1202 (as well as other memory banks of the multi-bank memory array). Instructions provided to state machine 1220 are implemented according to control logic configurations, enabling state machine to manage read, write, erase, data input, data output, and other functionality associated with memory cell array 1202. In some aspects, state machine 1220 can send and receive acknowledgments and negative acknowledgments regarding successful receipt or execution of various commands. In further embodiments, state machine 1220 can decode and implement status-related commands, decode and implement configuration commands, and so on.

To implement read, write, erase, input, output, etc., functionality, state machine 1220 can control clock source(s) 1208 or reference and control signal generator(s) 1218. Control of clock source(s) 1208 can cause output pulses configured to facilitate row controller 1204 and column controller 1206 implementing the particular functionality.

Output pulses can be transferred to selected bit lines by column controller 1206, for instance, or word lines by row controller 1204, for instance.

In connection with FIG. 13, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 13:
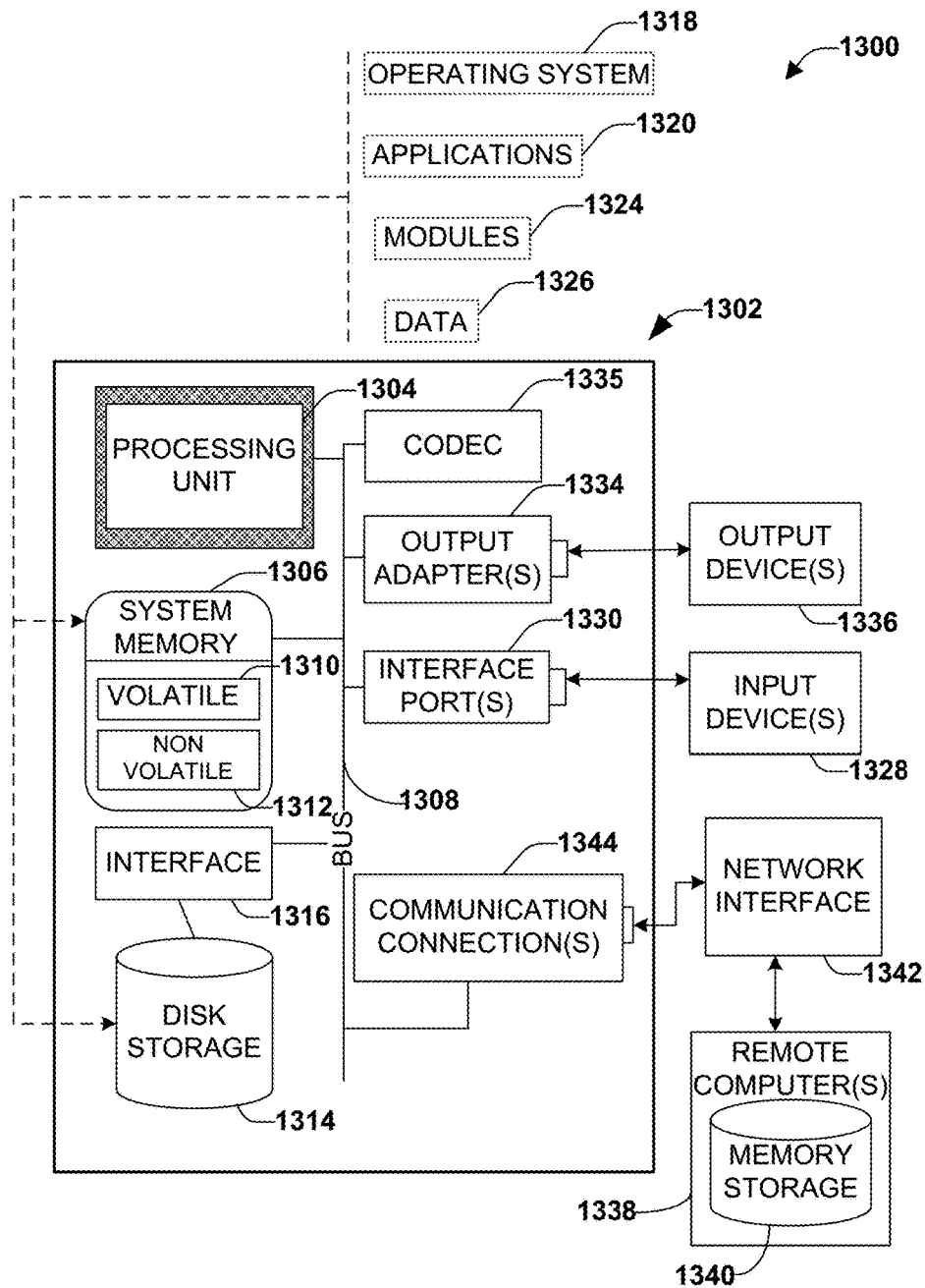
FIG. 13 illustrates a block diagram of an example computing environment that can be implemented in conjunction with various embodiments.

With reference to FIG. 13, a suitable operating environment 1300 for implementing various aspects of the claimed subject matter includes a computer 1302. The computer 1302 includes a processing unit 1304, a system memory 1306, a codec 1335, and a system bus 1308. The system bus 1308 communicatively inter-connects system components including, but not limited to, the system memory 1306 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1306 includes volatile memory 1310 and non-volatile memory 1314, which can employ one or more of the disclosed memory architectures, in various embodiments. The basic input/output system (BIOS), containing the basic routines to transfer information between elements within the computer 1302, such as during start-up, is stored in non-volatile memory 1312. In addition, according to present innovations, codec 1335 may include at least one of an encoder or decoder, wherein the at least one of an encoder or decoder may consist of hardware, software, or a combination of hardware and software. Although, codec 1335 is depicted as a separate component, codec 1335 may be contained within non-volatile memory 1312. By way of illustration, and not limitation, non-volatile memory 1312 can include read only memory (ROM), programmable ROM (PROM), electrically programmable ROM (EPROM), electrically erasable programmable ROM (EEPROM), Flash memory, or two-terminal memory (e.g., resistive-switching memory). Non-volatile memory 1312 can employ one or more of the disclosed multi-bank memory architectures, in at least some disclosed embodiments. Moreover, non-volatile memory 1312 can be computer memory (e.g., physically integrated with computer 1302 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1310 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1302 may also include removable/non-removable, volatile/non-volatile computer storage medium. FIG. 13 illustrates, for example, disk storage 1314. Disk storage 1314 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1314 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1314 to the system bus 1308, a removable or non-removable interface is typically used, such as interface 1316. It is appreciated that disk storage 1314 can store information related to a user. Such information might be stored at or provided to a server or to an application running on a user device. In one embodiment, the user can be notified (e.g., by way of output device(s) 1336) of the types of information that are stored to disk storage 1314 and/or transmitted to the server or application. The user can be provided the opportunity to opt-in or opt-out of having such information collected and/or shared with the server or application (e.g., by way of input from input device(s) 1328).

It is to be appreciated that FIG. 13 describes software that acts as an intermediary between users and the basic computer resources described in the suitable operating environment 1300. Such software includes an operating system 1318. Operating system 1318, which can be stored on disk storage 1314, acts to control and allocate resources of the computer 1302. Applications 1320 take advantage of the management of resources by operating system 1318 through program modules 1324, and program data 1326, such as the boot/shutdown transaction table and the like, stored either in system memory 1306 or on disk storage 1314. It is to be appreciated that the claimed subject matter can be implemented with various operating systems or combinations of operating systems.

A user enters commands or information into the computer 1302 through input device(s) 1328. Input devices 1328 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via interface port(s) 1330. Interface port(s) 1330 include, for example, a serial port, a parallel port, a game port, and a universal serial bus (USB). Output device(s) 1336 use some of the same type of ports as input device(s) 1328. Thus, for example, a USB port may be used to provide input to computer 1302, and to output information from computer 1302 to an output device 1336. Output adapter 1334 is provided to illustrate that there are some output devices, such as monitors, speakers, and printers, among other output devices, which require special adapters. The output adapter 1334 can include, by way of illustration and not limitation, video and sound cards that provide a means of connection between the output device 1336 and the system bus 1308. It should be noted that other devices and/or systems of devices provide both input and output capabilities such as remote computer(s) 1338.

Computer 1302 can operate in a networked environment using logical connections to one or more remote computers, such as remote computer(s) 1338. The remote computer(s) 1338 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1340 is illustrated with remote computer(s) 1338. Remote computer(s) 1338 is logically connected to computer 1302 through a network interface 1342 and then connected via communication connection(s) 1344. Network interface 1342 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1344 refers to the hardware/software employed to connect the network interface 1342 to the system bus 1308. While communication connection 1344 is shown for illustrative clarity inside computer 1302, it can also be external to computer 1302. The hardware/software necessary for connection to the network interface 1342 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An electronic memory, comprising:
a memory array comprising multiple banks of memory;
a communication interface comprising a command and address bus, and a data bus;
a set of mode registers comprising one or more index registers configured to store at least one bit of information that is read or written in response to a mode register command targeting the one or more index registers and received on the command and address bus;
a command and address decoder configured to receive an array command on the command and address bus, and employ the at least one bit of information stored by the index register to identify a first subset of the multiple banks of memory targeted by the array command; and
logic circuitry configured to execute the array command on the first subset of the multiple banks of memory identified from the at least one bit of information, wherein data read from the first subset of the multiple banks of memory or data written to the first subset of the multiple banks of memory in conjunction with executing the array command is transferred on the data bus, wherein:
the command and address decoder is further configured to identify the mode register command as an index register write command received on the command and address bus, and
the logic circuitry is further configured to receive index data on the data bus in conjunction with the index register write command and write the index data to the at least one bit of information stored by the index register.

2. The electronic memory of claim 1, wherein the index register is configured to store at least eight bits of information to distinctly address at least 256 memory banks of the multiple banks of memory, or 256 individually addressable subsets of the multiple banks of memory.

3. The electronic memory of claim 1, wherein the logic circuitry is configured to:
reference the index register in response to the command and address decoder receiving an array command that targets less than all of the multiple banks of memory and determine from the at least one bit of information stored by the index register a target subset of the memory banks for the array command; and
ignore the index register in response to the array command targeting all the multiple banks of memory.

4. The electronic memory of claim 1, further comprising a set of status registers respectively configured to monitor status information for respective subsets of the multiple banks of memory, a first status register of the set of status registers being configured to monitor status information for the first subset of the multiple banks of memory.

5. The electronic memory of claim 4, wherein the command and address decoder is configured to identify a status register command received on the command and address bus.

6. The electronic memory of claim 5, wherein the logic circuit is configured to reference the index register in response to the command and address decoder receiving the status register command and identify from the at least one bit of information a target subset of the set of status registers for the status register command.

7. The electronic memory of claim 4, wherein the set of status registers comprises one status register for each one of the multiple banks of memory, and further wherein the at least one bit of information stored by the index register comprises a number of data bits to uniquely address each of the set of status registers.

8. The electronic memory of claim 1, wherein the data bus is a 16 bit data bus.

9. The electronic memory of claim 1, wherein the multiple banks of memory are respective arrays of non-volatile, two-terminal memory.

10. The electronic memory of claim 1, wherein the communication interface is a dynamic random access memory (DRAM) communication interface and the command and address decoder operates according to a DRAM communication protocol.

11. The electronic memory of claim 1, further comprising a global status output component.

12. The electronic memory of claim 11, wherein the global status output component includes a global status register of the set of mode registers configured to store status information related to the multiple banks of memory and output the stored status information in response to a global status register read command.

13. The electronic memory of claim 11, wherein the global status output component includes a global status bus comprising at least one global pin providing global status information from the group of global pins consisting of: a ready/busy global pin, a memory pass/fail global pin, and an error correction code pass/fail global pin.

14. The electronic memory of claim 1, wherein the command and address decoder receives the mode register command and identifies the mode register command as the index register write command prior to receiving the array command.

15. The electronic memory of claim 1, wherein the command and address decoder is further configured to receive a memory configuration command on the command and address bus, and wherein the logic circuitry is configured to obtain the index data written to the at least one bit of information from the index register to identify the first subset of the multiple banks of memory and to execute the memory configuration command for the first subset of the multiple banks of memory, wherein the memory configuration command is selected from a group consisting essentially of: setting the first subset of the multiple banks of memory to single level or multi level cell operation, setting an operation voltage for the first subset of the multiple banks of memory, setting a burst configuration for the first subset of the multiple banks of memory, setting a clock speed for the first subset of the multiple banks of memory and setting a latency for the first subset of the multiple banks of memory.

16. A method of operating a memory device, comprising:
compiling an array access command for performing a memory operation on a first memory bank of a set of memory banks of the memory device;
compiling a mode register write command and including in the mode register write command:
register address data identifying an index register of a set of mode registers of the memory device as a target of the mode register write command, and
bank address data identifying the first memory bank of the set of memory banks, the bank address data to be written by the memory device to the index register in conjunction with executing the mode register write command;
issuing the mode register write command to the memory device; and
issuing the array access command to the memory device.

17. The method of claim 16, further comprising:
compiling a second array access command for performing a second memory operation on a second memory bank of the memory device;
compiling a second mode register write command and including in the second mode register write command:
the register address data identifying the index register as the target of the second mode register write command, and
second bank address data identifying the second memory bank, the second bank address data to be written by the memory device to the index register in conjunction with execution of the second mode register write command; and
issuing the second mode register write command to the memory device; and
issuing the second array access command to the memory device.

18. The method of claim 17, further comprising:
compiling a status register read command for obtaining status information for a first status register associated with the first memory bank;
compiling a third mode register write command and including in the third mode register write command:
the register address data identifying the index register as the target of the third mode register write command, and
status address data identifying the first status register, the status address data to be written by the memory device to the index register in conjunction with execution of the third mode register write command;
issuing the third mode register write command to the memory device; and
issuing the status register read command to the memory device.

19. The method of claim 16, further comprising:
compiling a status register read command for obtaining status information for a first status register associated with the first memory bank, wherein the first status register is accessed with the bank address data identifying the first memory bank; and
issuing the status register read command to the memory device.

20. The method of claim 19, further comprising:
receiving the status information for the first status register in response to issuing the status register read command;
determining from the status information at least one of: a busy or idle status, a pass or fail status, or an error correction code (ECC) failure status for the first memory bank; and at least one of:
issuing a second array access command for the first memory bank in response to determining the idle status for the first memory bank;
issuing a failure correction command for correcting the memory operation in response to determining the fail status for the first memory bank; or
issuing an ECC command for correcting a bit error associated with the first memory bank in response to determining the ECC status.

* * * * *